United States Patent
Li et al.

(10) Patent No.: US 12,336,246 B2
(45) Date of Patent: Jun. 17, 2025

(54) SEMICONDUCTOR STRUCTURES WITH A HYBRID SUBSTRATE

(71) Applicant: Taiwan Semiconductor Manufacturing Company, Ltd., Hsinchu (TW)

(72) Inventors: Ming-Shuan Li, Hsinchu County (TW); Chih Chieh Yeh, Taipei (TW); Shih-Hao Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 845 days.

(21) Appl. No.: 17/465,214

(22) Filed: Sep. 2, 2021

(65) Prior Publication Data
US 2022/0359647 A1    Nov. 10, 2022

Related U.S. Application Data

(60) Provisional application No. 63/185,130, filed on May 6, 2021.

(51) Int. Cl.
| | | |
|---|---|---|
| *H10D 62/40* | (2025.01) | |
| *H10D 30/67* | (2025.01) | |
| *H10D 64/01* | (2025.01) | |
| *H10D 86/40* | (2025.01) | |
| *H10D 86/60* | (2025.01) | |

(52) U.S. Cl.
CPC ....... *H10D 62/405* (2025.01); *H10D 30/6735* (2025.01); *H10D 64/017* (2025.01); *H10D 86/40* (2025.01); *H10D 86/60* (2025.01)

(58) Field of Classification Search
CPC ... H01L 29/045; H01L 29/165; H01L 29/267; H01L 29/66545
See application file for complete search history.

(56) References Cited

U.S. PATENT DOCUMENTS

| | | | |
|---|---|---|---|
| 6,784,071 B2 | 8/2004 | Chen et al. | |
| 7,208,815 B2 * | 4/2007 | Chen | H01L 21/823878 257/527 |
| 7,432,149 B2 | 10/2008 | Wu et al. | |
| 9,293,582 B2 * | 3/2016 | Currie | H01L 27/092 |

(Continued)

FOREIGN PATENT DOCUMENTS

| | | |
|---|---|---|
| JP | 2008227026 A | 9/2008 |
| JP | 2009200471 A | 9/2009 |

OTHER PUBLICATIONS

P.Packan, et al., "High Performance Hi-K + Metal Gate Strain Enhanced Transistors on (110) Silicon", IEEE International Conference: Electron Devices Meeting, 2008, 4 pages, Intel Corporation, Hillsboro, US.

*Primary Examiner* — Vincent Wall
(74) *Attorney, Agent, or Firm* — HAYNES AND BOONE, LLP

(57) ABSTRACT

A semiconductor structure includes N-type MBC transistors formed over a first region of a hybrid substrate and P-type MBC transistors formed over a second region of the hybrid substrate. The first region and the second region have top surfaces with different crystal orientations. Particularly, the first region for forming the N-type MBC transistors includes a top surface having a (100) crystal plane and the second region for forming P-type MBC transistors includes a top surface having a (110) crystal plane.

20 Claims, 40 Drawing Sheets

(56) References Cited

U.S. PATENT DOCUMENTS

| | | | |
|---|---|---|---|
| 10,032,867 B1* | 7/2018 | Yeung | H01L 29/0649 |
| 10,535,680 B2 | 1/2020 | Shen et al. | |
| 10,546,957 B2* | 1/2020 | Xu | H01L 21/30604 |
| 11,289,573 B2* | 3/2022 | Wu | H01L 21/823418 |
| 11,495,688 B2* | 11/2022 | Cheng | H01L 21/76895 |
| 2007/0122983 A1* | 5/2007 | Pan | H01L 29/7838 |
| | | | 257/E29.267 |
| 2008/0227241 A1 | 9/2008 | Nakabayshie et al. | |
| 2013/0056795 A1* | 3/2013 | Wu | H01L 21/02123 |
| | | | 257/E29.255 |
| 2013/0207167 A1* | 8/2013 | Cui | H01L 29/0847 |
| | | | 438/296 |
| 2013/0341704 A1* | 12/2013 | Rachmady | H01L 29/0673 |
| | | | 977/890 |
| 2015/0194307 A1* | 7/2015 | Gaire | H01L 21/823821 |
| | | | 257/190 |
| 2016/0064288 A1* | 3/2016 | Cheng | H01L 29/165 |
| | | | 438/222 |
| 2016/0099338 A1* | 4/2016 | Chang | H01L 29/42392 |
| | | | 438/157 |
| 2016/0104799 A1* | 4/2016 | Qi | H01L 29/6656 |
| | | | 257/29 |
| 2017/0133375 A1* | 5/2017 | Fung | H01L 27/0924 |
| 2017/0170331 A1* | 6/2017 | Liang | H01L 29/1608 |
| 2017/0358677 A1* | 12/2017 | Cheng | H01L 21/823807 |
| 2018/0301564 A1* | 10/2018 | Kwon | H01L 29/0653 |
| 2020/0105872 A1* | 4/2020 | Glass | H01L 21/26513 |
| 2021/0074840 A1* | 3/2021 | Chen | H01L 21/823807 |
| 2021/0134677 A1* | 5/2021 | Pan | H01L 29/66439 |
| 2022/0359647 A1* | 11/2022 | Li | H01L 21/823807 |
| 2023/0031490 A1* | 2/2023 | Shih | H01L 29/66742 |

* cited by examiner

SEMICONDUCTOR STRUCTURES WITH A HYBRID SUBSTRATE

PRIORITY

This application claims the priority to U.S. Provisional Application Ser. No. 63/185,130, filed May 6, 2021, entitled "Semiconductor Structures and Methods of Fabrication Thereof," the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of IC structures and fabrication processes. For example, improving device performance becomes more challenging when device sizes continue to decrease. Although methods for addressing such a challenge have been generally adequate, they have not been entirely satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
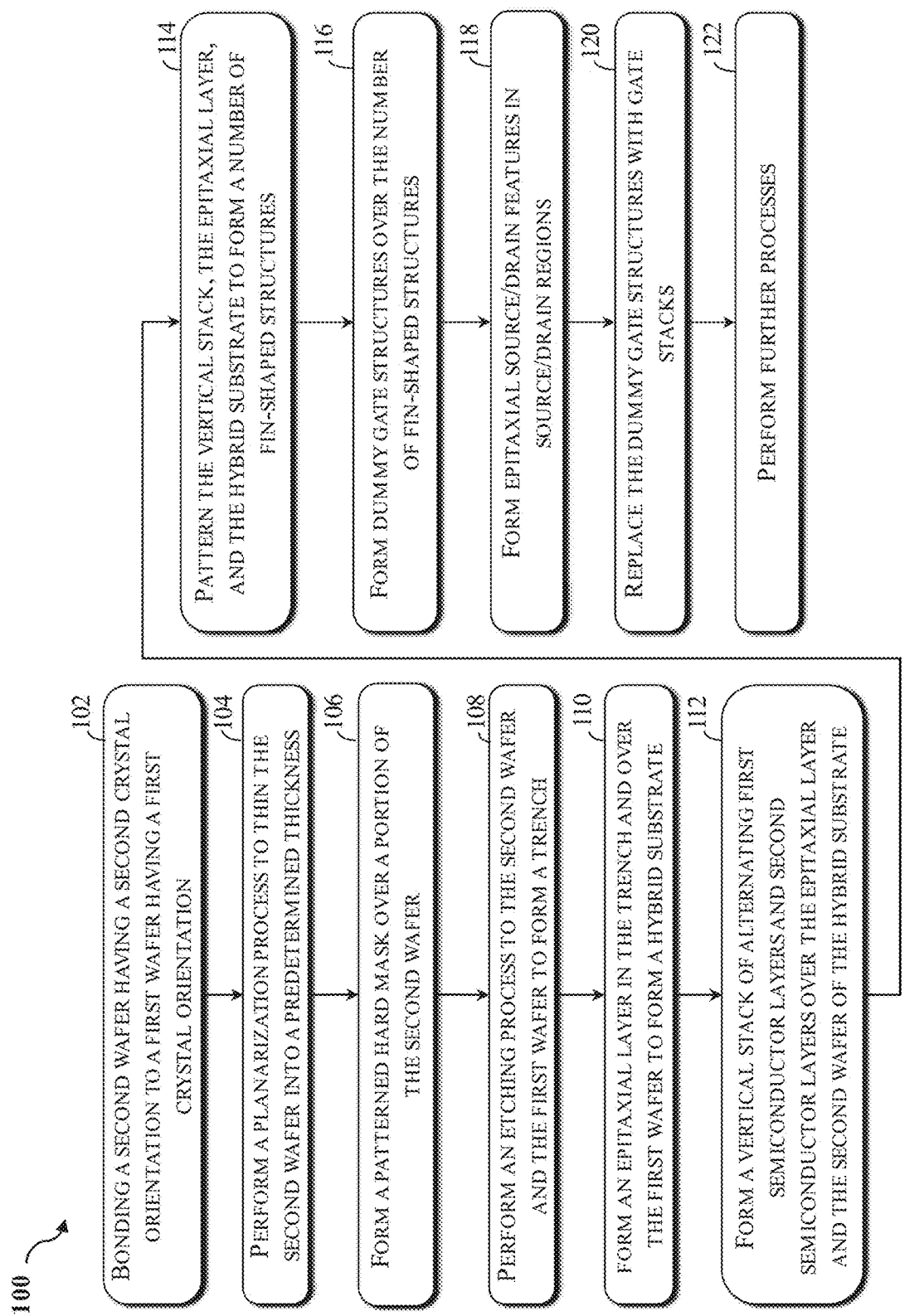
FIG. 1 illustrates a flow chart of a method for forming a semiconductor device including N-type multi-bridge-channel (MBC) transistors formed over a first region of a substrate having a first crystal orientation and P-type MBC transistors formed over a second region of the substrate having a second crystal orientation, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

Multi-gate devices, such as multi-bridge-channel (MBC) transistors, have been introduced in an effort to improve gate control by increasing gate-channel coupling, reduce OFF-state current, and reduce short-channel effects (SCEs). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, or other nanostructures and for that reasons, an MBC transistor may also be referred to as a nanowire transistor or a nanosheet transistor. The three-dimensional structure of the multi-gate devices, allows them to be aggressively scaled while maintaining gate control and mitigating SCEs.

The present disclosure provides semiconductor structures formed over a hybrid substrate and a method making the same. The semiconductor structure includes N-type MBC transistors formed over a first region of the hybrid substrate and P-type MBC transistors formed over a second region of the hybrid substrate. The first region and the second region have top surfaces with different crystal orientations. Particularly, the first region for forming the N-type MBC transistors has a top surface including a (100) crystal plane and the second region for forming P-type MBC transistors has a top surface including a (110) crystal plane. Thus, both N-type MBC transistors and P-type MBC transistors have enhanced mobility and improved device performance.

The various aspects of the present disclosure will now be described in more detail with reference to the figures. In that regard, FIG. 1 is a flowchart illustrating method 100 of forming a semiconductor device according to embodiments of the present disclosure. Method 100 is described below in conjunction with FIGS. 2-40, which are fragmentary cross-sectional views or fragmentary top views of a workpiece 200 at different stages of fabrication according to embodiments of method 100. Method 100 is merely an example and is not intended to limit the present disclosure to what is explicitly illustrated therein. Additional steps may be provided before, during, and/or after the method 100, and some steps described can be replaced, eliminated, or moved around for additional embodiments of the method. Not all steps are described herein in detail for reasons of simplicity. Because the workpiece 200 will be fabricated into a semiconductor structure 200 upon conclusion of the fabrication processes, the workpiece 200 may be referred to as the semiconductor structure 200 as the context requires. For avoidance of doubts, the X, Y and Z directions in FIGS. 2-40 are perpendicular to one another and are used consistently throughout FIGS. 2-40. Throughout the present disclosure, like reference numerals denote like features unless otherwise excepted.

Figure 2:
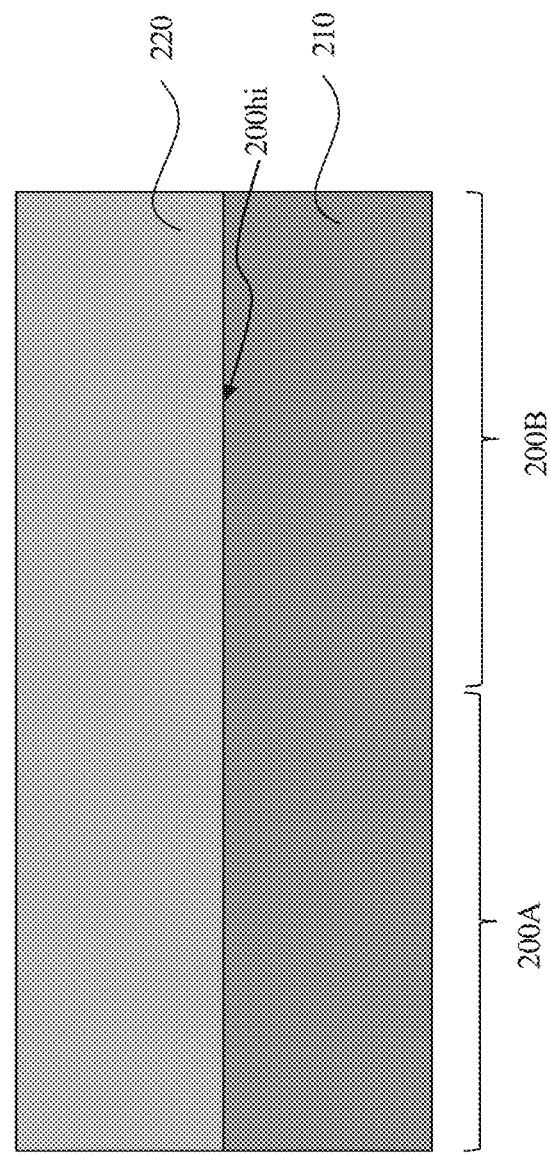
FIGS. 2-16 illustrate fragmentary cross-sectional views of an exemplary workpiece during various fabrication stages in the method of FIG. 1, according to one or more aspects of the present disclosure.

Referring to FIGS. 1 and 2, method 100 includes a block 102 where a first wafer 210 and a second wafer 220 are provided, and the second wafer 220 is bonded with the first wafer 210. In embodiments represented in FIG. 2, the second wafer 220 is disposed over and bonded with the first wafer 210. The first wafer 210 and the second wafer 220 each may be a semiconductor substrate, including, for example, silicon. Alternatively or additionally, the first wafer 210 and the second wafer 220 each includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Each of the first wafer 210 and the second wafer 220 may consist of silicon or include a silicon top surface. In this present embodiment, the first wafer 210 is a bulk silicon wafer (i.e., including bulk single-crystalline silicon) and a top surface of the first wafer 210 has a (100) crystal plane, and the second wafer 220 is a bulk silicon wafer and a top surface of the second wafer 220 has a (110) crystal plane. The second wafer 220 is bonded onto the first wafer 210 by one or more suitable bonding techniques. After bonding, the workpiece 200 includes a horizontal interface 200*hi* between the first wafer 210 and the second wafer 220. In this present embodiment, the workpiece 200 includes a first region 200A where N-type MBC transistors are to be formed and a second region 200B where P-type MBC transistors are to be formed.

Figure 3:
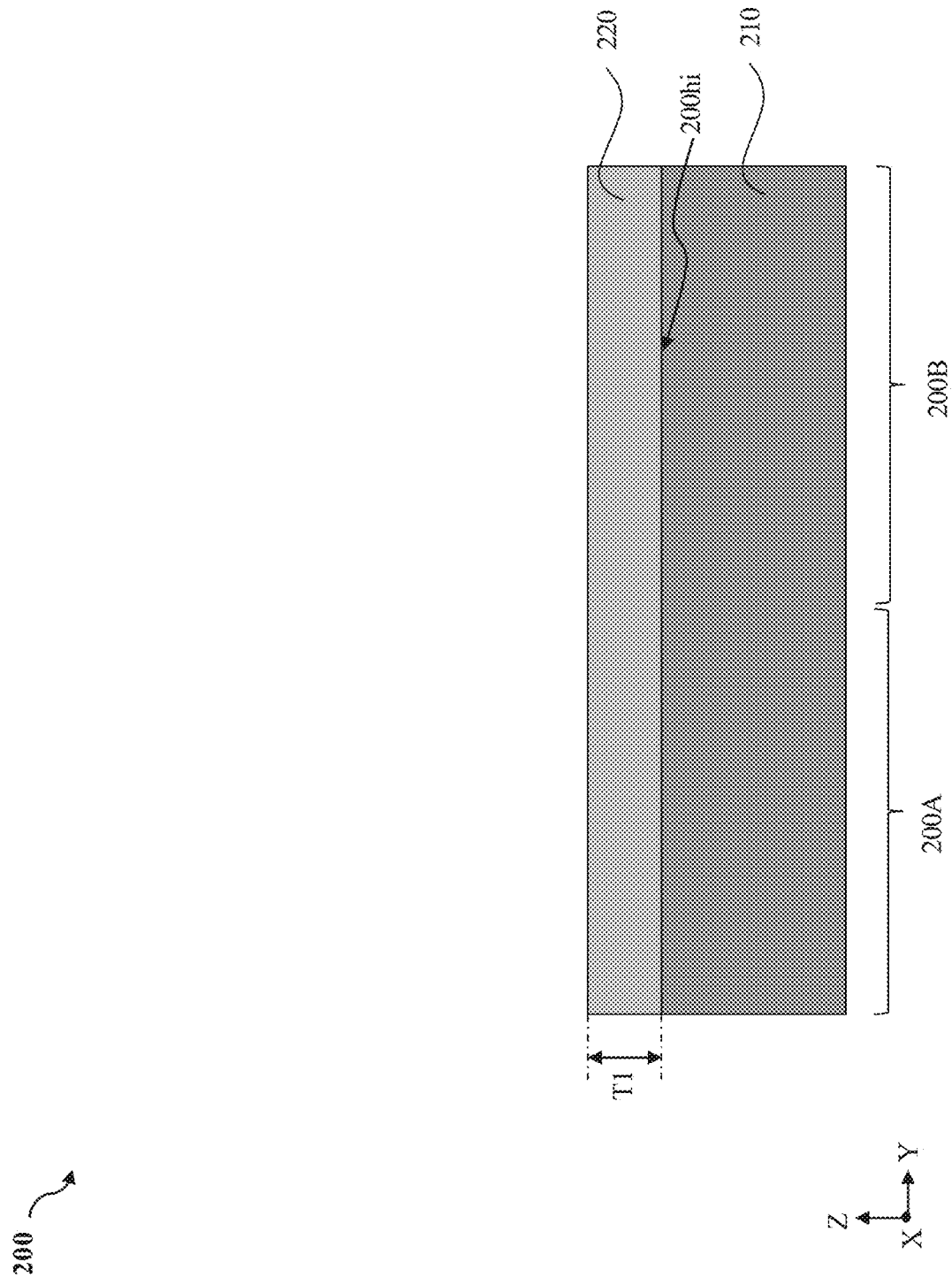

Referring to FIGS. 1 and 3, method 100 includes a block 104 where a planarization process is performed to the workpiece 200 to thin the second wafer 220. The planarization process may include chemical mechanical polishing (CMP) or other suitable processes. After the planarization process, a thickness T1 (along the Z direction) of the second wafer 220 may be between about 80 nm and about 200 nm such that the to-be-formed P-type MBC transistors over the second region 200B would have satisfactory characterizations.

Figure 4:
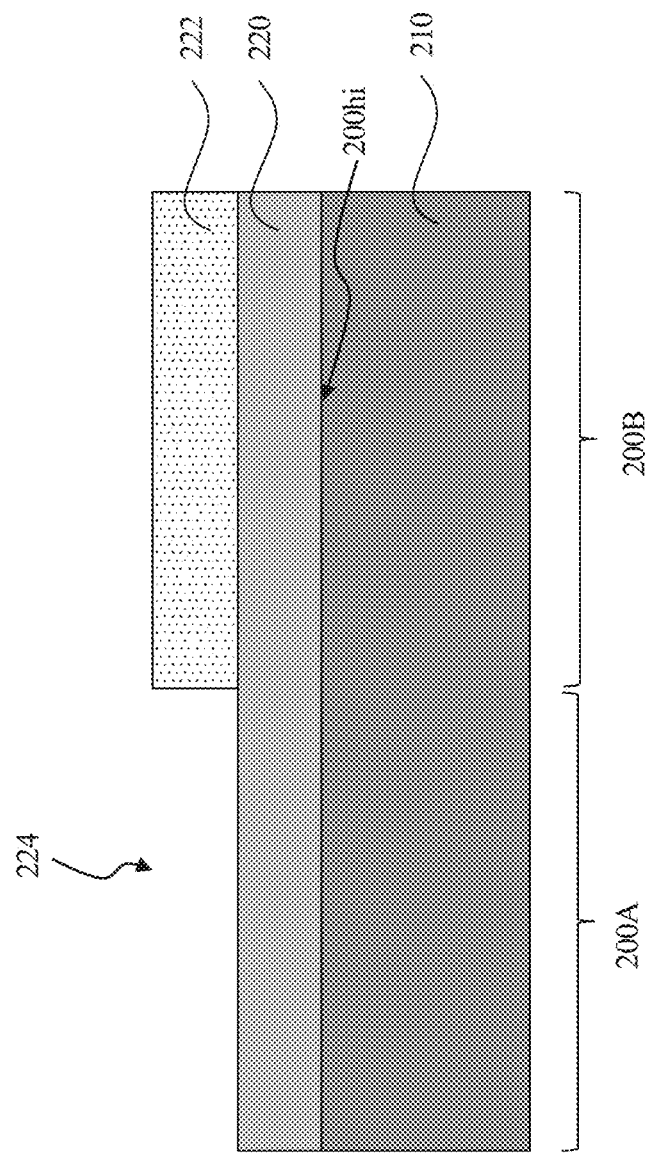

Referring to FIGS. 1 and 4, method 100 includes a block 106 where a patterned hard mask 222 is formed in the second region 200B and over the second wafer 220. In some embodiments, a hard mask layer may be formed over the second wafer 220 in both the first region 200A and the second region 200B. The hard mask layer may include silicon nitride, titanium nitride, silicon carbonitride, or other suitable materials. The hard mask layer may be then patterned by a lithography process to form an opening 224 exposing the second wafer 220 in the first region 200A. An exemplary lithography process includes spin-on coating a photoresist layer, soft baking of the photoresist layer, mask aligning, exposing, post-exposure baking, developing the photoresist layer, rinsing, and drying (e.g., hard baking). The photoresist layer may be removed after forming the patterned hard mask 222.

Figure 5:
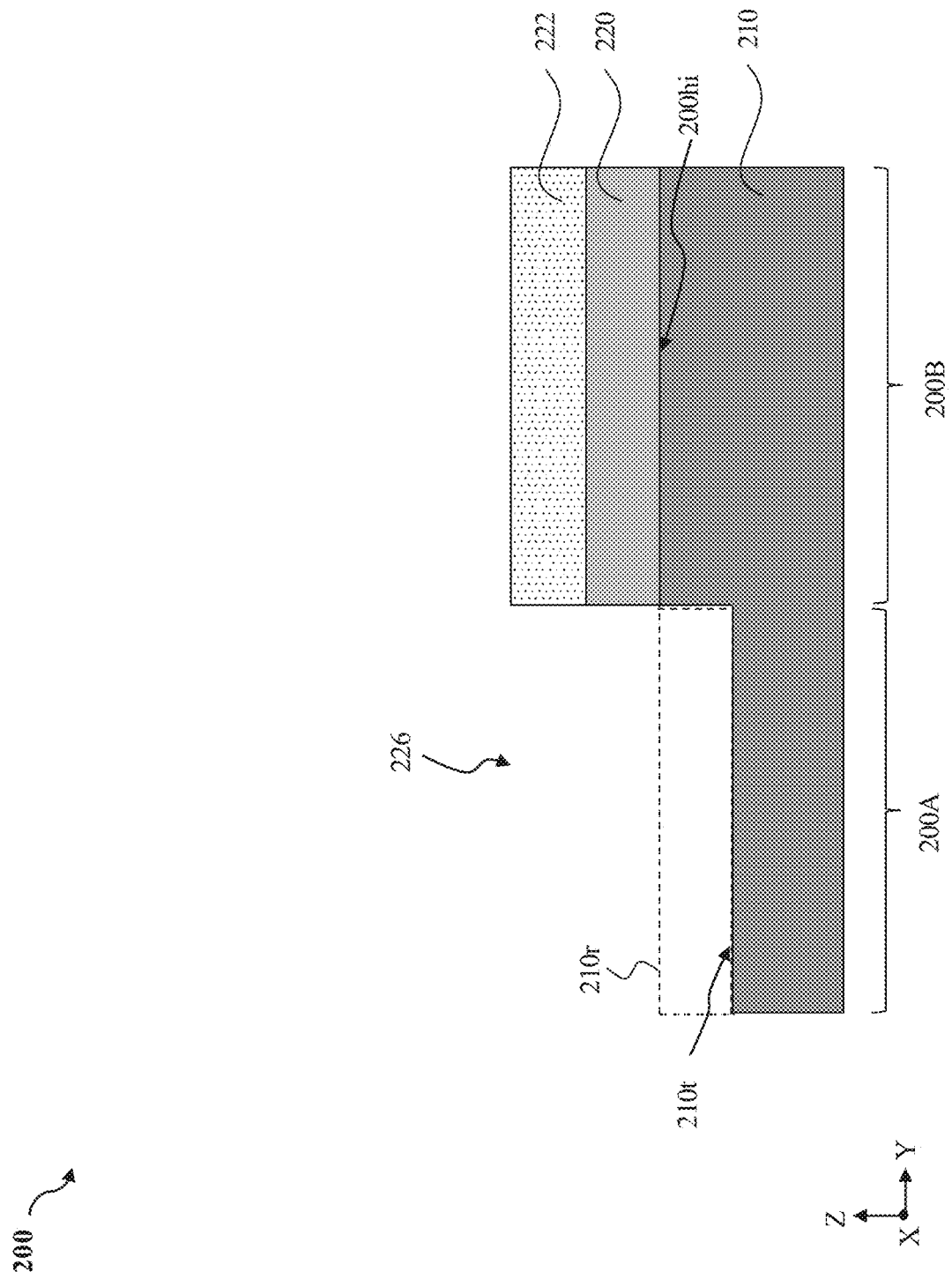

Referring to FIGS. 1 and 5, method 100 includes a block 108 where an etching process is performed to the workpiece 200 to form a trench 226. As exemplary shown in FIG. 5, while using the patterned hard mask 222 as an etch mask, the etching process removes the portion of the second wafer 220 in the first region 200A exposed by the opening 224 and a portion 210*r* of the first wafer 210 directly under that portion of the second wafer 220. The trench 226 exposes a top surface 210*t* and a sidewall surface of the first wafer 210 and also exposes a sidewall surface of the second wafer 220. In this depicted example, due to the removal of the portion 210*r* of the first wafer 210, the top surface 210*t* is lower than the horizontal interface 200*hi*. In some embodiments, the etching process employed in block 108 includes dry etching processes, wet etching processes, or combinations thereof. An exemplary selective dry etching process may implement $CF_4$, $NF_3$, $Cl_2$, HBr, other suitable gases and/or plasmas, and/or combinations thereof.

Figure 6:
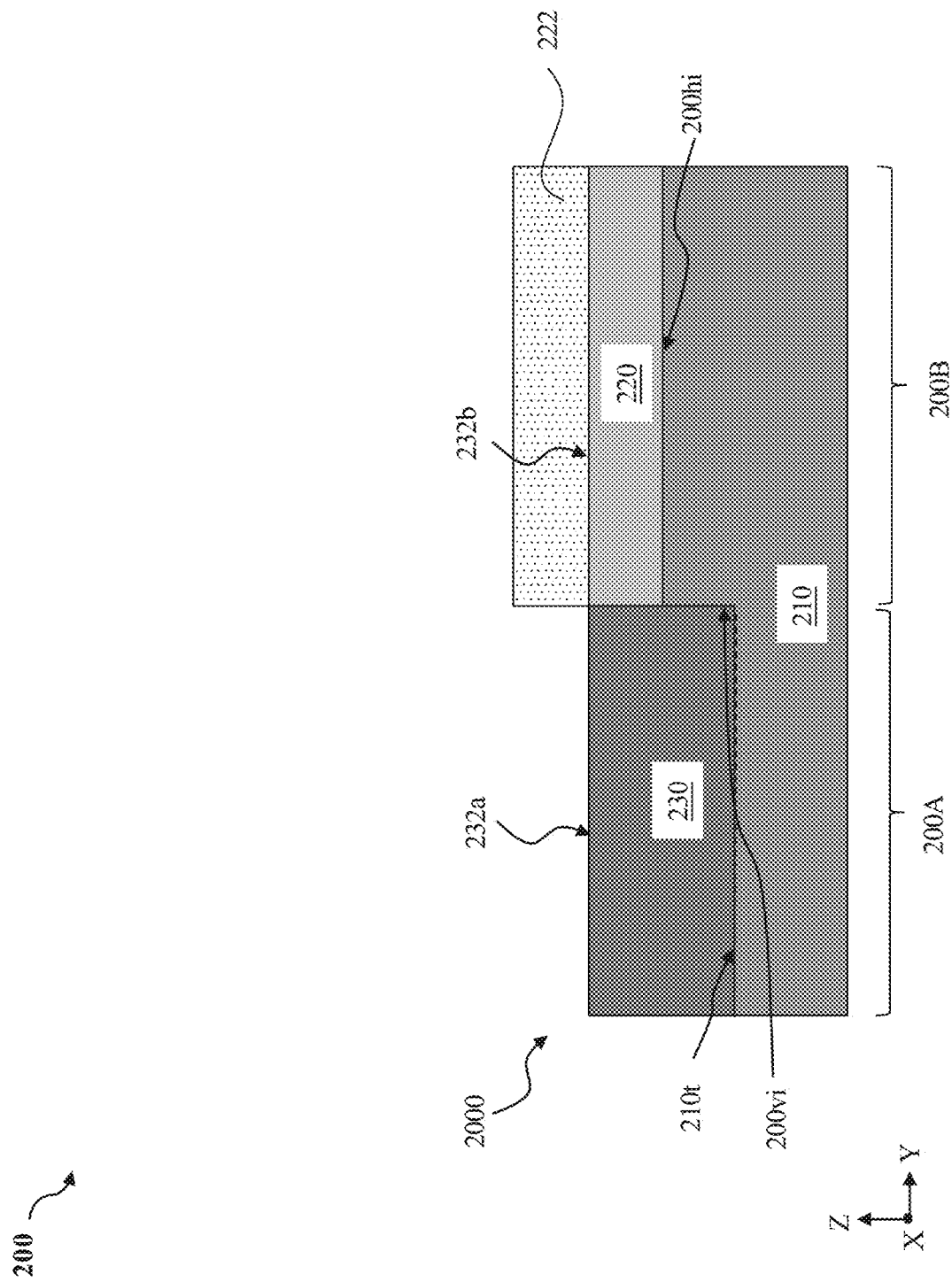

Referring to FIGS. 1 and 6, method 100 includes a block 110 where an epitaxial growth process is performed to the workpiece 200 to epitaxially grow a semiconductor layer 230 in the trench 226. The semiconductor layer 230 tracks the shape of the trench 226 and thus has a thickness equal to the depth of the trench 226. Since the semiconductor layer 230 is formed on the top surface 210*t* of the first wafer 210, the bottom surface of the semiconductor layer 230 is coplanar with the top surface 210*t*. The top surface 210*t* may also be referred to as the bottom surface 210*t* of the semiconductor layer 230. The semiconductor layer 230 may be formed by using processes such as vapor-phase epitaxy (VPE), ultra-high vacuum chemical vapor deposition (UHV-CVD), low pressure vapor deposition (LPCVD), and/or plasma-enhanced chemical vapor deposition (PECVD), molecular beam epitaxy (MBE), or other suitable epitaxy processes, or combinations thereof. The epitaxial growth process allows the semiconductor layer 230 to grow from the exposed top surface 210*t* and sidewall surface of the first wafer 210 and exposed sidewall surface of the second wafer 220. The semiconductor layer 230 may also be referred to as epitaxial semiconductor layer 230. In this depicted example, the epitaxial semiconductor layer 230 includes silicon and a top surface of the semiconductor layer 230 has the (100) crystal plane. After forming the epitaxial semiconductor layer 230, the patterned hard mask 222 may be removed. Thus, a hybrid substrate 2000 including the epitaxial semiconductor layer 230 having a first top surface 232a with a first crystal plane (e.g., (100) crystal plane) in the first region 200A and the second wafer 220 having a second top surface 232b with a second crystal plane (e.g., (110) crystal plane) in the second region 200B is formed. The second top surface 232b is substantially coplanar with the first top surface 232a. The workpiece 200 includes a vertical interface 200vi between the epitaxial semiconductor layer 230 and the first wafer 210 and between the epitaxial semiconductor layer 230 and the second wafer 220.

Figure 7:
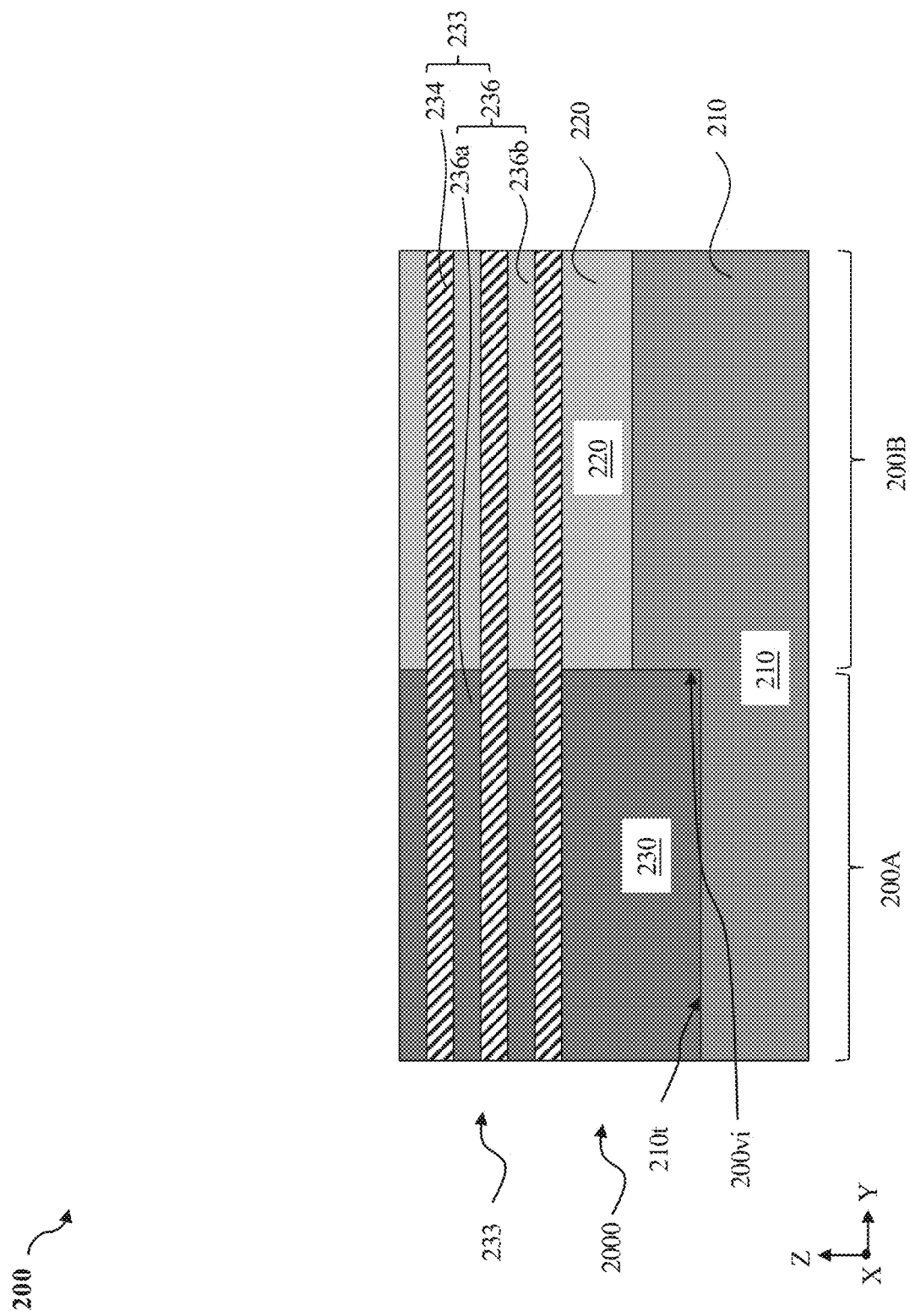

Referring to FIGS. 1 and 7, method 100 includes a block 112 where epitaxial growth processes are performed to the workpiece 200 to epitaxially grow a vertical stack 233 of alternating first semiconductor layers and second semiconductor layers 236 over the hybrid substrate 2000. The first semiconductor layers and second semiconductor layers 236 may be epitaxially deposited on the hybrid substrate 2000 using molecular beam epitaxy (MBE), vapor-phase epitaxy (VPE), ultra-high vacuum CVD (UHV-CVD), and/or other suitable epitaxial growth processes. In the depicted embodiment, the vertical stack 233 of alternating first semiconductor layers and second semiconductor layers 236 may include a plurality of channel layers 236 interleaved by a plurality of sacrificial layers 234. The numbers of sacrificial layers 234 and channel layers 236 shown in FIG. 7 are only examples. Other numbers of sacrificial layers 234 and channel layers 236 are possible. The channel layer 236 may be formed of silicon (Si) and the sacrificial layer 234 may be formed of silicon germanium (SiGe). It is noted that, the channel layers 236 formed over the first region 200A (may also be referred to as channel layers 236a) has the same crystal orientation as the epitaxial semiconductor layer 230, and the channel layers 236 formed over the second region 200B (may also be referred to as channel layers 236b) has the same crystal orientation as the second wafer 220. That is, the channel layers 236a each include a (100) crystal plane and the channel layers 236b each include a (110) crystal plane. In an embodiment, due to the growth rate difference between the channel layers 236a and channel layers 236b, the epitaxial growth processes used to form the vertical stack 233 may include a first epitaxial growth process configured to form the portion of the vertical stack 233 in the first region 200A and a second epitaxial growth process configured to form the portion of the vertical stack 233 in the second region 200B.

Figure 8:
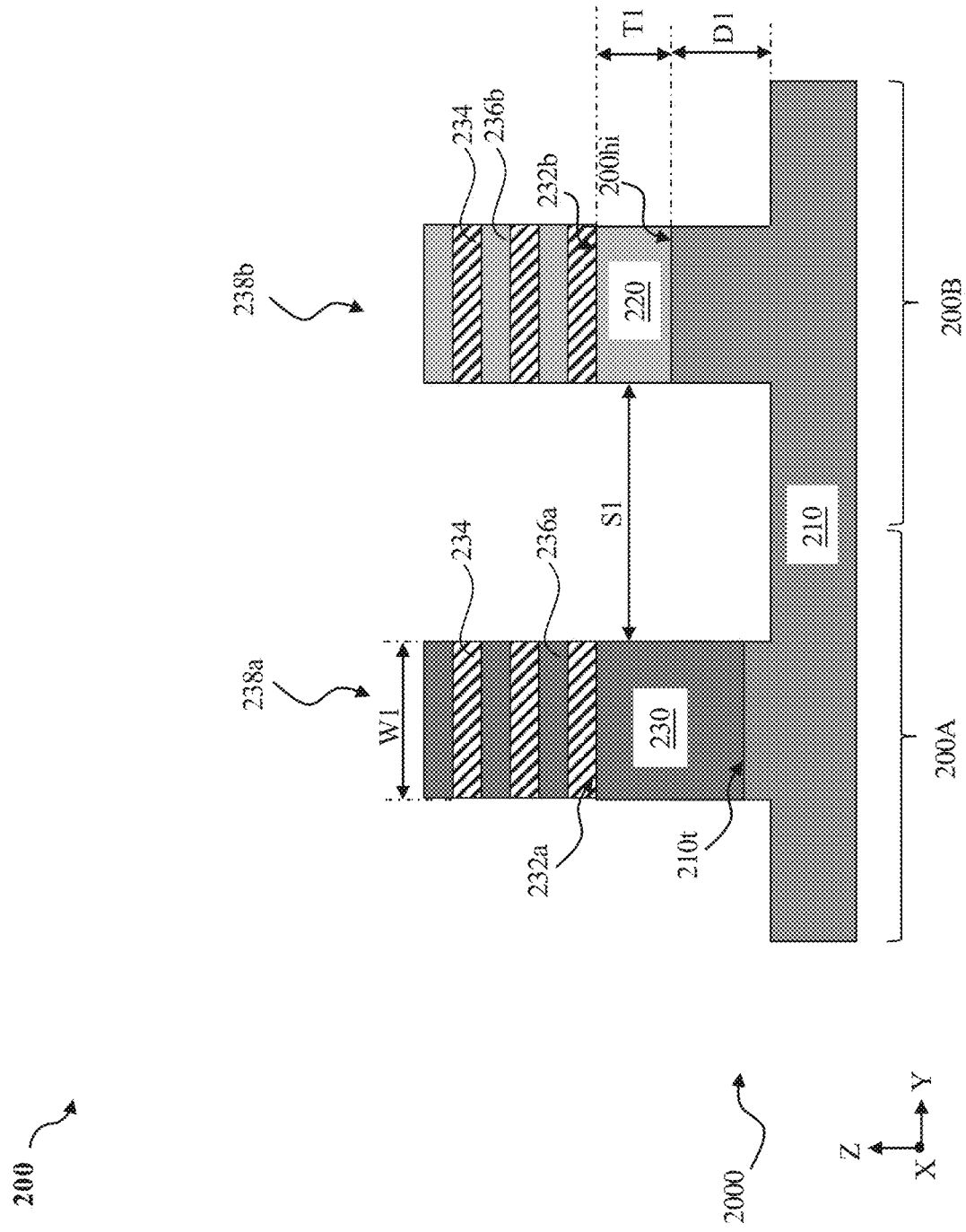
Figure 9:
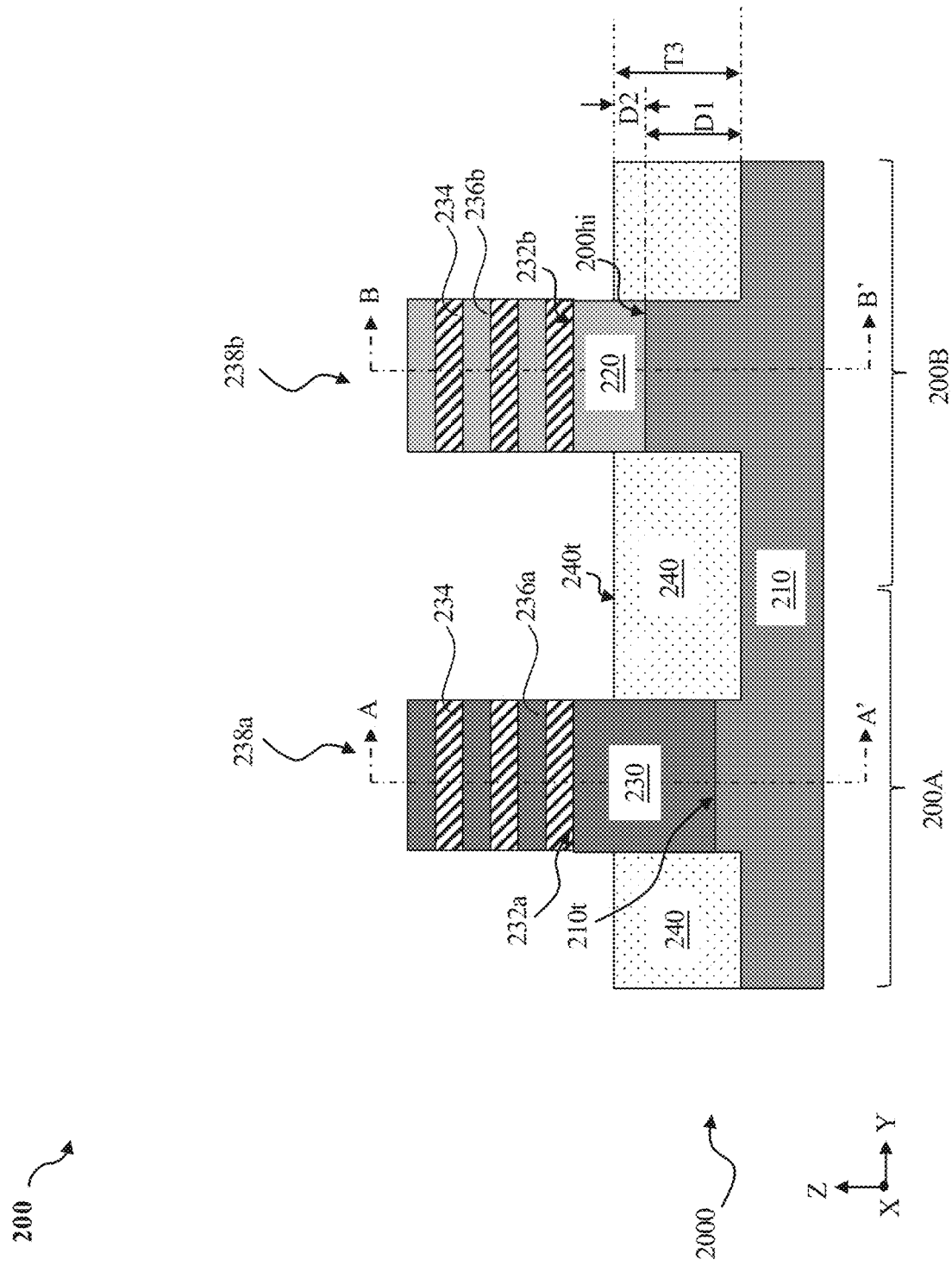

Referring to FIGS. 1 and 8-9, method 100 includes a block 114 where the vertical stack 233 and the hybrid substrate 2000 are patterned to form a number of fin-shaped structures such as the fin-shaped structures 238a and 238b. A combination of lithography and etch steps may be applied to form the fin-shaped structures 238a and 238b. In some instances, the patterning of the vertical stack 233 and the hybrid substrate 2000 may be performed using double-patterning or multi-patterning processes to create patterns having pitches smaller than what is otherwise obtainable using a single, direct photolithography process. The etching process can include dry etching, wet etching, reactive ion etching (RIE), and/or other suitable processes. It is noted that, after the patterning, the workpiece 200 doesn't include the vertical interface 200vi. That is, the patterning removes the vertical interface 200vi.

In the embodiment represented in FIG. 8, the fin-shaped structure 238a is formed over the first region 200A and includes the sacrificial layers 234, the channel layers 236a, the epitaxial semiconductor layer 230, and a portion of the substrate 210. The fin-shaped structure 238b is formed over the second region 200B and includes the sacrificial layers 234, the channel layers 236b, the second wafer 220 and a portion of the first wafer 210. That is, the epitaxial semiconductor layer 230 in the first region 200A and the first wafer 210 in the second region 200B are patterned. After the patterning of the vertical stack 233 and the hybrid substrate 2000, the workpiece 200 includes a top surface 2000t exposing the substrate 210.

Each of the fin-shaped structure 238a and the fin-shaped structure 238b has a width W1 along the Y direction. The fin-shaped structure 238a is spaced apart from the fin-shaped structure 238b by a spacing S1. In an embodiment, a ratio of the width W1 to the spacing S1 (i.e., W1/S1) may be between about 0.5 and about 2 to facilitate forming an isolation feature between the fin-shaped structures 238-238b without significantly affecting the device density. In some embodiments, S1 may be between about 10 nm and about 100 nm and W1 may be between about 15 nm and about 60 nm to be readily integrated into existing semiconductor fabrication processes. After the patterning of the vertical stack 233 and the hybrid substrate 2000, the patterned hybrid substrate 2000 includes a top surface 2000t. A distance between the horizontal interface 200hi and the top surface 2000t is referred to as D1. In an embodiment, a ratio of T1 to D1 (i.e., T1/D1) may be between about 10 and about 20 such that the seam of the first wafer 210 and the second wafer 220 is covered by the to-be-formed isolation feature to provide satisfactory device performance. In some embodiments, D1 may be between about 10 nm and about 100 nm to be readily integrated into existing semiconductor fabrication processes. In an embodiment, the spacing S1 is greater than the distance D1. The fin-shaped structure 238a extends lengthwise along the X direction and is divided into channel regions 205C, source regions 205S, and drain regions 205D (shown in FIG. 10). The fin-shaped structure 238b extends lengthwise along the X direction and is divided into channel regions 205C', source regions 205S', and drain regions 205D' (shown in FIG. 11). A distance between the bottommost channel layer 236a in the first region 200a and the first wafer 210 (i.e., a total thickness of the sacrificial layer 234 and the epitaxial semiconductor layer 230) is greater than a distance between the bottommost channel layer 236b in the second region 200b and the first wafer 210 (e.g., a total thickness of the sacrificial layer 234 and the second wafer 220).

After forming fin-shaped structures such as the fin-shaped structures 238a-238b, as shown in FIG. 9, an isolation feature 240 is deposited in trenches that define the fin-shaped structures (such as fin-shaped structures 238a-238b) to isolate one fin-shaped structure (e.g., fin-shaped structure 238a) from an adjacent fin-shaped structure (e.g., fin-shaped structure 238b). The isolation feature 240 may also be referred to as a shallow trench isolation (STI) feature. In an exemplary process, a dielectric material for the isolation feature is deposited over the workpiece 200 using CVD, subatmospheric CVD (SACVD), flowable CVD (FCVD), physical vapor deposition (PVD), spin-on coating, and/or other suitable process. Then the deposited dielectric material is planarized and recessed until the fin-shaped structure 238a-238b rises above the isolation feature 240. The dielectric material for the STI feature 240 may include silicon oxide, silicon oxynitride, fluorine-doped silicate glass (FSG), a low-k dielectric, combinations thereof, and/or other suitable materials.

In embodiments represented in FIG. 9, each of the first top surface 232a and the second top surface 232b is higher than a top surface 240t of the STI feature 240. The top surface 240t of the STI feature 240 is higher than the horizontal interface 200hi to provide satisfactory device performance. In this depicted example, the top surface 240t of the STI feature 240 is also higher than the bottom surface 210t of the semiconductor layer 230 to substantially avoid introducing defects (e.g., dislocations that may be potentially induced by the interface of the two different crystal planes) into the active region of the device. A distance between the top surface 240t of the STI feature 240 and the horizontal interface 200hi is referred to as D2. In some embodiments, a ratio of D2 to D1 may be between about 9 and about 20 to form device with satisfactory performance. The distance D2 may be between about 90 nm and about 200 nm, and a thickness T3 of the STI feature 240 may be between about 100 nm and about 300 nm to be readily integrated into existing semiconductor fabrication processes.

After forming the STI feature 240, processes such as forming cladding layers extending along the sidewalls of the fin-shaped structures 238a-238b may be performed. The cladding layers may be removed along with the sacrificial layers 234 in the channel release process after removing dummy gate structures. After forming the cladding layers, dielectric fins 242 (shown in FIG. 14) may be then formed over the STI feature 240 and adjacent to the cladding layers. Helmet layer 244 (shown in FIG. 14), which may be formed of high-k materials, may be formed over the dielectric fins 242 to divide to-be-formed metal gate stacks into multiple pieces. Detailed description for forming those features are omitted for reason of simplicity.

Figure 10:
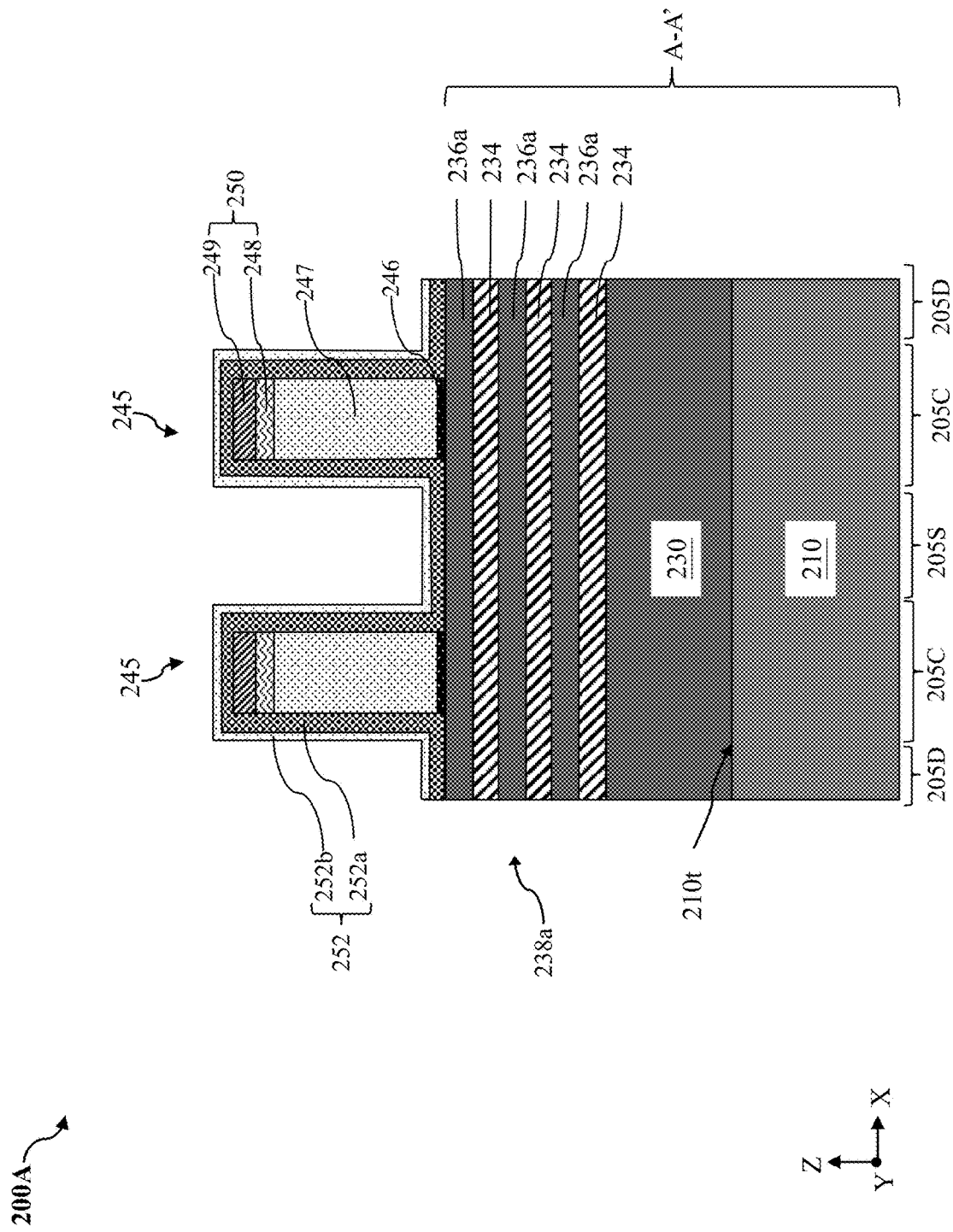
Figure 11:
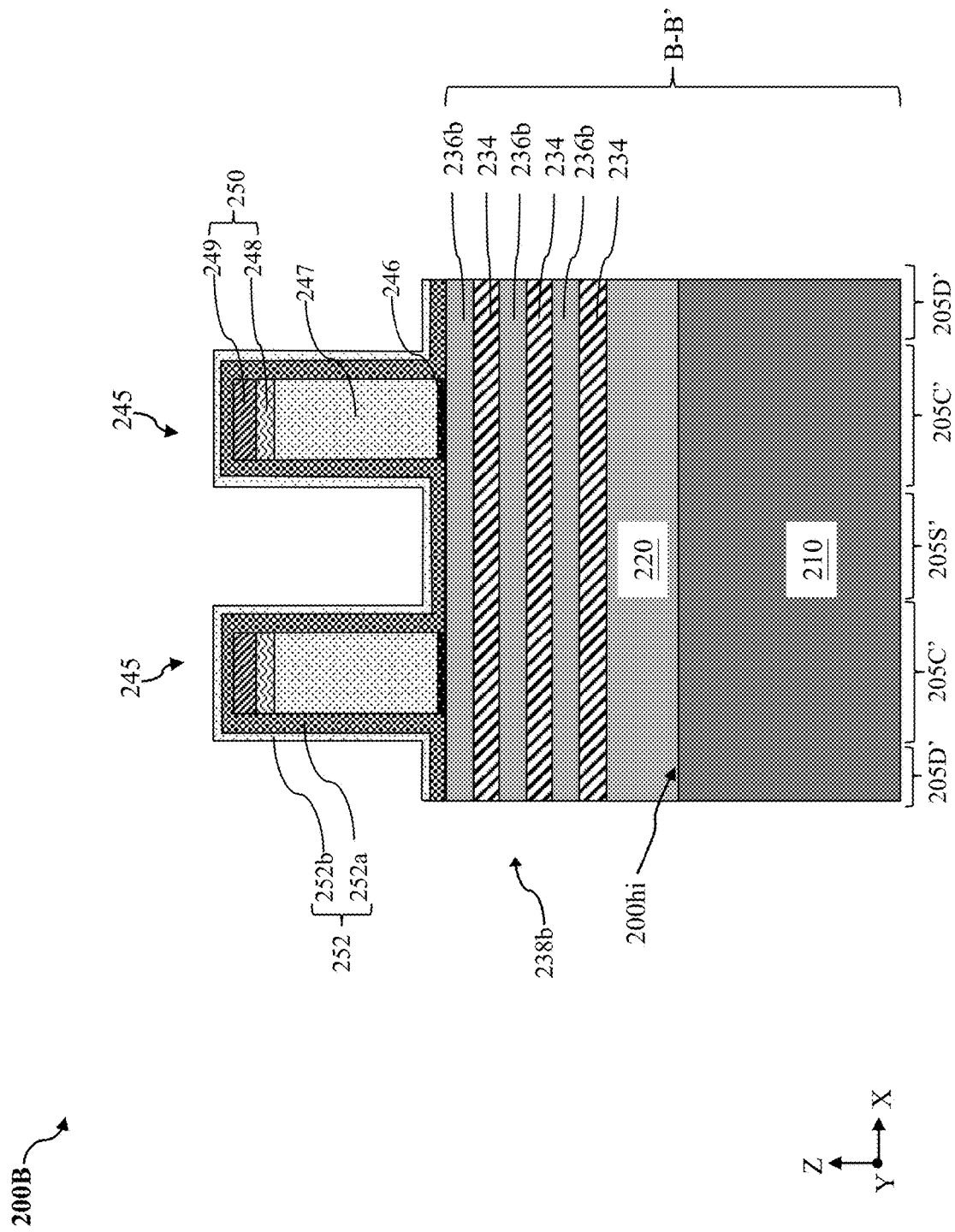

Referring to FIGS. 1 and 10-11, method 100 includes a block 116 where a dummy gate structure 245 is formed over the channel regions 205C of the fin-shaped structure 238a in the first region 200A and the channel regions 205C' of the fin-shaped structure 238b in the second region 200B. FIG. 10 depicts a fragmentary cross-sectional view of the workpiece 200 taken along line A-A' in FIG. 9, and FIG. 11 depicts a fragmentary cross-sectional view of the workpiece 200 taken along line B-B' in FIG. 9. The channel regions 205C/205C' also define source regions 205S/205S' and drain regions 205D/205D' that are not vertically overlapped by the dummy gate structures 245. Each of the channel regions 205C/205C' is disposed between a source region 205S/205S' and a drain region 205D/205D' along the X direction. Two dummy gate structures 245 are shown in FIG. 10 and two dummy gate structures 245 are shown in FIG. 11 but the workpiece 200 may include more dummy gate structures 245. In this embodiment, a gate replacement process (or gate-last process) is adopted where the dummy gate structures 245 serve as placeholders for functional gate stacks. Other processes and configuration are possible. The dummy gate structure 245 includes a dummy dielectric layer 246, a dummy gate electrode layer 247 over the dummy dielectric layer 246, and a gate-top hard mask layer 250 over the dummy gate electrode layer 247. The dummy dielectric layer 246 may include silicon oxide. The dummy gate electrode layer 247 may include polysilicon. The gate-top hard mask layer 250 may be a multi-layer that includes a silicon oxide layer 248 and a silicon nitride layer 249 formed on the silicon oxide layer 248. Suitable deposition process, photolithography and etching process may be employed to form the dummy gate structure 245. In this depicted example, the dummy gate structure 245 extends along both the first region 200A and the second region 200B. It is noticed that, in some embodiments, a structure of the dummy gate structure formed over the channel region 200C may be different from that of the dummy gate structure formed over the channel region 200C'.

As shown in FIGS. 10-11, the workpiece 200 also includes a gate spacer layer 252. In this depicted example, the gate spacer layer 252 includes a first gate spacer layer 252a and a second gate spacer layer 252b deposited conformally over the workpiece 200, including over top surfaces and sidewalls of the dummy gate structures 245 and top surfaces of the fin-shaped structures 238a-238b. In some implementations, a dielectric constant of the second gate spacer layer 252b is greater than that of the first gate spacer layer 252a, and the second gate spacer layer 252b is more etch resistant than the first gate spacer layer 252a. In some embodiments, the first gate spacer layer 252a may include silicon oxide, silicon oxycarbide, or a suitable low-k dielectric material. The second gate spacer layer 252b may include silicon carbonitride, silicon nitride, zirconium oxide, aluminum oxide, or a suitable dielectric material. The first gate spacer layer 252a and the second gate spacer layer 252b may be deposited over the dummy gate structures 245 using processes such as, CVD, SACVD, FCVD, atomic layer deposition (ALD), PVD, or other suitable process.

Figure 12:
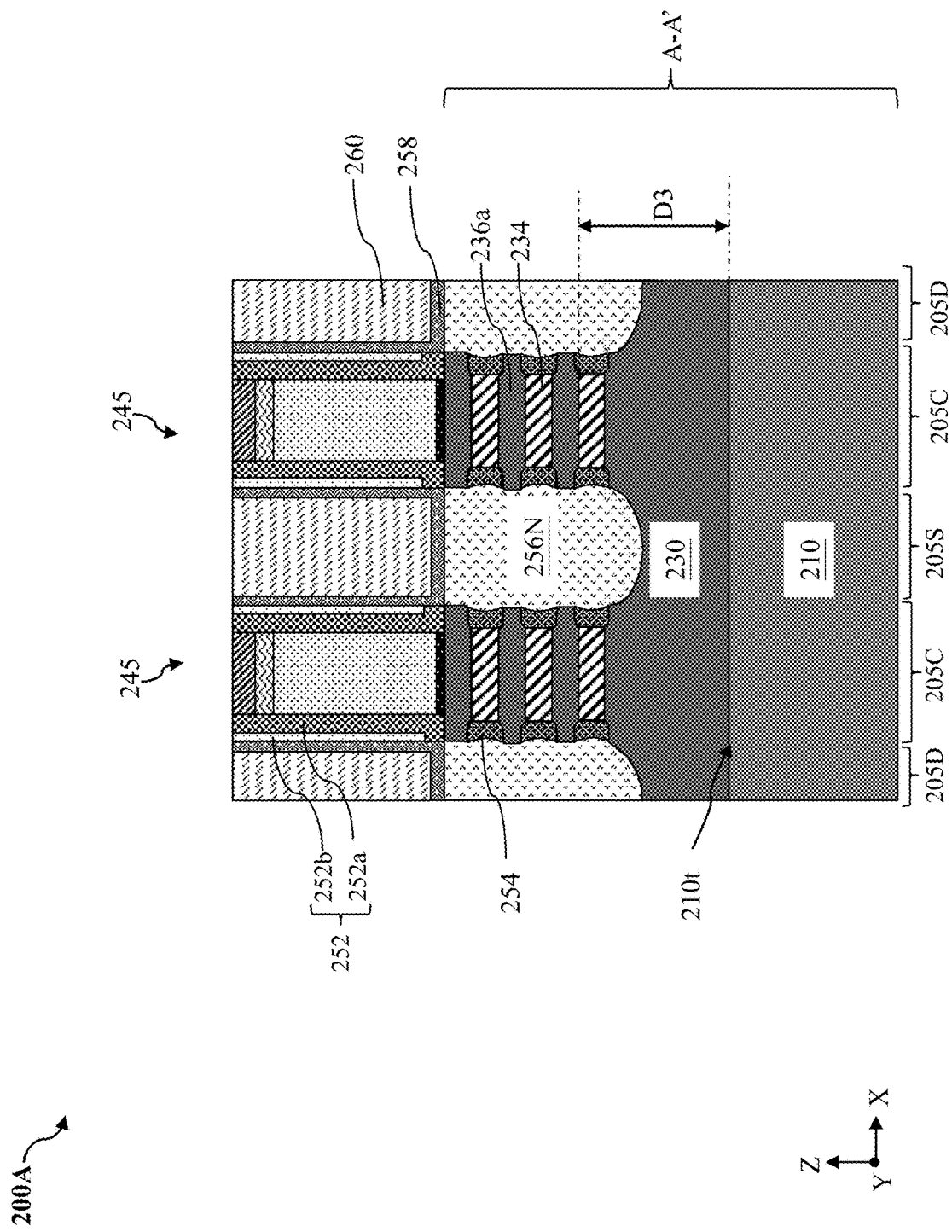

Referring to FIGS. 1 and 12-14, method 100 includes a block 118 where N-type source/drain features 256N are formed over source/drain regions 205S/250D of the fin-shaped structure 238a in the first region 200A and P-type source/drain features 256P are formed over source/drain regions 205S'/205D' of the fin-shaped structure 238b in the second region 200B. FIG. 12 depicts a fragmentary cross-sectional view of the workpiece 200 taken along line A-A' and FIG. 13 fragmentary cross-sectional view of the workpiece 200 taken along line B-B'. The formation of source/drain features 256N and source/drain features 256P may include performing one or more etching processes to recess source/drain regions 205S/250D of the fin-shaped structure 238a and source/drain regions 205S'/250D' of the fin-shaped structure 238b to form first source/drain trenches (filled by source/drain features 256N) and second source/drain trenches (filled by source/drain features 256P). While not explicitly shown, a photolithography process and at least one hard mask may be used before or during the performing of operations in block 118. In some embodiments, the portions of the fin-shaped structures 238a-238b not covered by the dummy gate structure 245 and the gate spacer layer 252 (i.e., the source regions 205S/205S' and drain regions 205D/205D') are etched by a dry etch or a suitable etching process to form the first source/drain trenches and the second source/drain trenches. The dry etch process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. In this depicted example, both the first source/drain trenches and the second source/drain trenches extend below the bottom-most sacrificial layer 234. That is, the epitaxial semiconductor layer 230 in the first region 200A and the second wafer 220 in the second region 200B are partially etched.

After forming the first and second source/drain trenches and before forming the source/drain features 256N and source/drain features 256P, inner spacer features 254 may be formed in the first region 200A and second region 200B. The formation of inner spacer features 254 may include multiple processes such as recessing the sacrificial layers 234 in the fin-shaped structures 238a-238b to form inner spacer recesses while the channel layers 236 are substantially unetched. A dielectric layer may be deposited over the first region 200A and the second region 200B to fill the inner spacer recesses. The dielectric layer may include silicon oxide, silicon nitride, silicon oxycarbide, silicon oxycarbonitride, silicon carbonitride, metal nitride, or a suitable dielectric material. Excess dielectric layer may be removed to form the inner spacer features 254.

After forming the inner spacer features 254 in the first region 200A and the second region 200B, a patterned film may be deposited directly over the second region 200B, N-type epitaxial source/drain features 256N are then formed in the first source/drain trenches in the first region 200A. Suitable epitaxial processes for forming source/drain features 256N may include vapor-phase epitaxy (VPE), molecular beam epitaxy (MBE), and/or other suitable processes. The epitaxial growth process may use gaseous and/or liquid precursors, which interact with the composition of the epitaxial semiconductor layer 230 as well as the channel layers 236a. In the embodiments represented in FIG. 12, the N-type epitaxial source/drain features 256N are in direct contact with the channel layers 236a, the inner spacer features 254, and the portions of the epitaxial semiconductor layer 230 exposed in the first source/drain trenches in the first region 200A. In various embodiments, the N-type epitaxial source/drain features 256N may include Si, GaAs, GaAsP, SiP, or other suitable material. The N-type epitaxial source/drain features 256N may be in-situ doped during the epitaxial process by introducing doping species including n-type dopants, such as phosphorus or arsenic; and/or other suitable dopants including combinations thereof. If the N-type epitaxial source/drain features 256N are not in-situ doped, an implantation process (i.e., a junction implant process) may be further performed to form the N-type epitaxial source/drain features 256N. In an exemplary embodiment, the N-type epitaxial source/drain features 256N include (100) orientated silicon with N-type dopants.

After forming the N-type epitaxial source/drain features 256N in the first region 200A, the patterned film covering the second region 200B may be removed, and another patterned film may be formed over the workpiece 200 to cover the first region 200A and expose the second region 200B. The P-type source/drain feature 256P may be epitaxially and selectively formed to fill the second source/drain trenches in the second region 200B by using an epitaxial process, such as an MBE process, a VPE process, an UHV-CVD process, an MOCVD process, and/or other suitable epitaxial growth processes. The epitaxial growth process may use gaseous and/or liquid precursors, which interact with the composition of the second wafer 220 and the channel layers 236b. In various embodiments, the P-type epitaxial source/drain features 256P may include Si, Ge, AlGaAs, SiGe, boron-doped SiGe, or other suitable material. The P-type epitaxial source/drain features 256P may be in-situ doped during the epitaxial process by introducing doping species including p-type dopants, such as boron or $BF_2$, and/or other suitable dopants including combinations thereof. If the P-type epitaxial source/drain features 256P are not in-situ doped, an implantation process (i.e., a junction implant process) is performed to dope the p-type epitaxial source/drain features 256P. In an exemplary embodiment, the P-type epitaxial source/drain features 256P include boron-doped SiGe. In another embodiment, the P-type epitaxial source/drain features 256P include (110) orientated silicon with P-type dopants. In embodiments described above, the N-type source/drain features 256N are formed before forming the P-type source/drain features 256P. It is understood that the P-type source/drain features 256P may be formed before forming the N-type source/drain features 256N. It is noted that, a distance D3 (shown in FIG. 12) between the bottommost channel layers 236a and the first wafer 210 is greater than a distance D4 (shown in FIG. 13) between the bottommost channel layers 236b and the first wafer 210.

Figure 13:
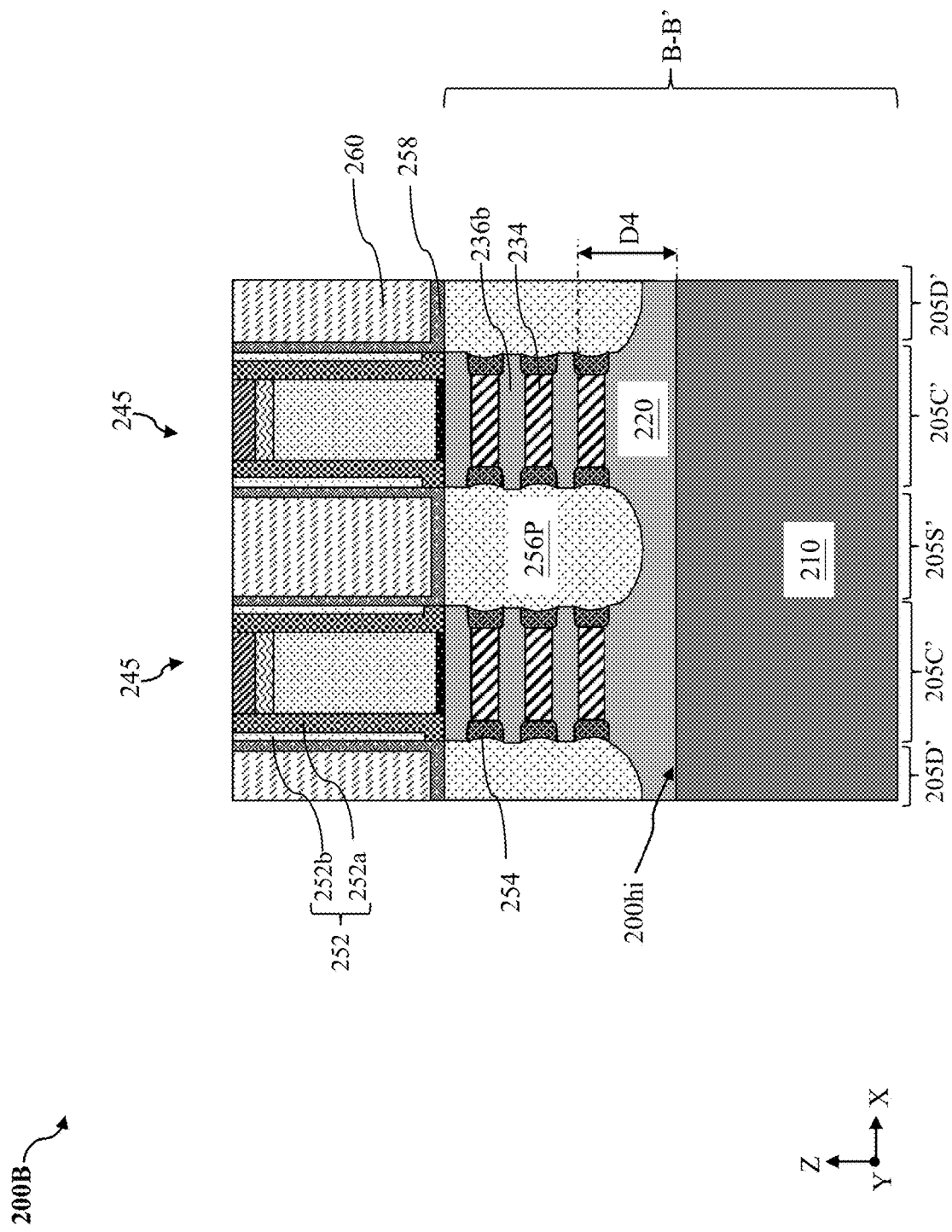

Still referring to FIGS. 12-13, a contact etch stop layer (CESL) 258 and an interlayer dielectric (ILD) layer 260 are deposited over the workpiece 200. The CESL 258 may include silicon nitride, silicon oxynitride, and/or other materials known in the art and may be formed by ALD, plasma-enhanced chemical vapor deposition (PECVD) process and/or other suitable deposition or oxidation processes. As shown in FIGS. 12-13, the CESL 258 may be deposited on top surfaces of the source/drain features 256N, 256P, and sidewalls of the gate spacer layer 252. The ILD layer 260 is deposited by a PECVD process or other suitable deposition technique over the workpiece 200 after the deposition of the CESL 258. The ILD layer 260 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials.

Figure 14:
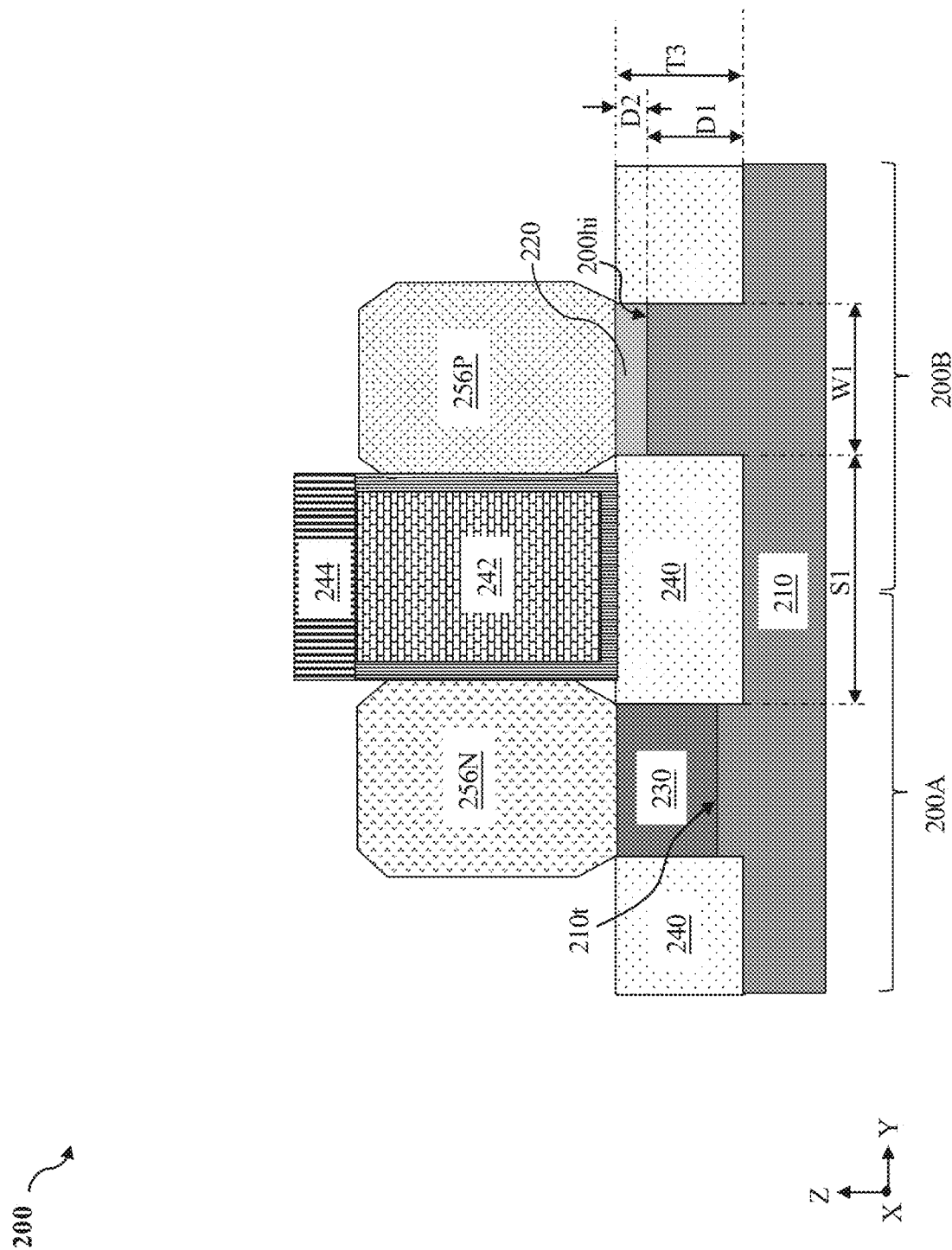

FIG. 14 depicts a cross-sectional view of the workpiece 200 when viewed from the X direction. As shown in FIG. 14, the N-type source/drain feature 256N formed in the first region 200A is spaced apart from the P-type source/drain features 256P formed in the second region 200B by the dielectric fin 242. In this depicted example, the dielectric fin 242 includes a two-layer structure that having an outer layer wrapping around a bottom surface and sidewall surfaces of an inner layer. The helmet layer 244 is formed over the dielectric fins 242 to, for example, divide to-be-formed gate stacks into multiple pieces. In this present embodiment, a distance between the N-type source/drain features 256N and the top surface 210t of the first wafer 210 is greater than a distance D2 between the P-type source/drain features 256P and the first wafer 210.

Figure 15:
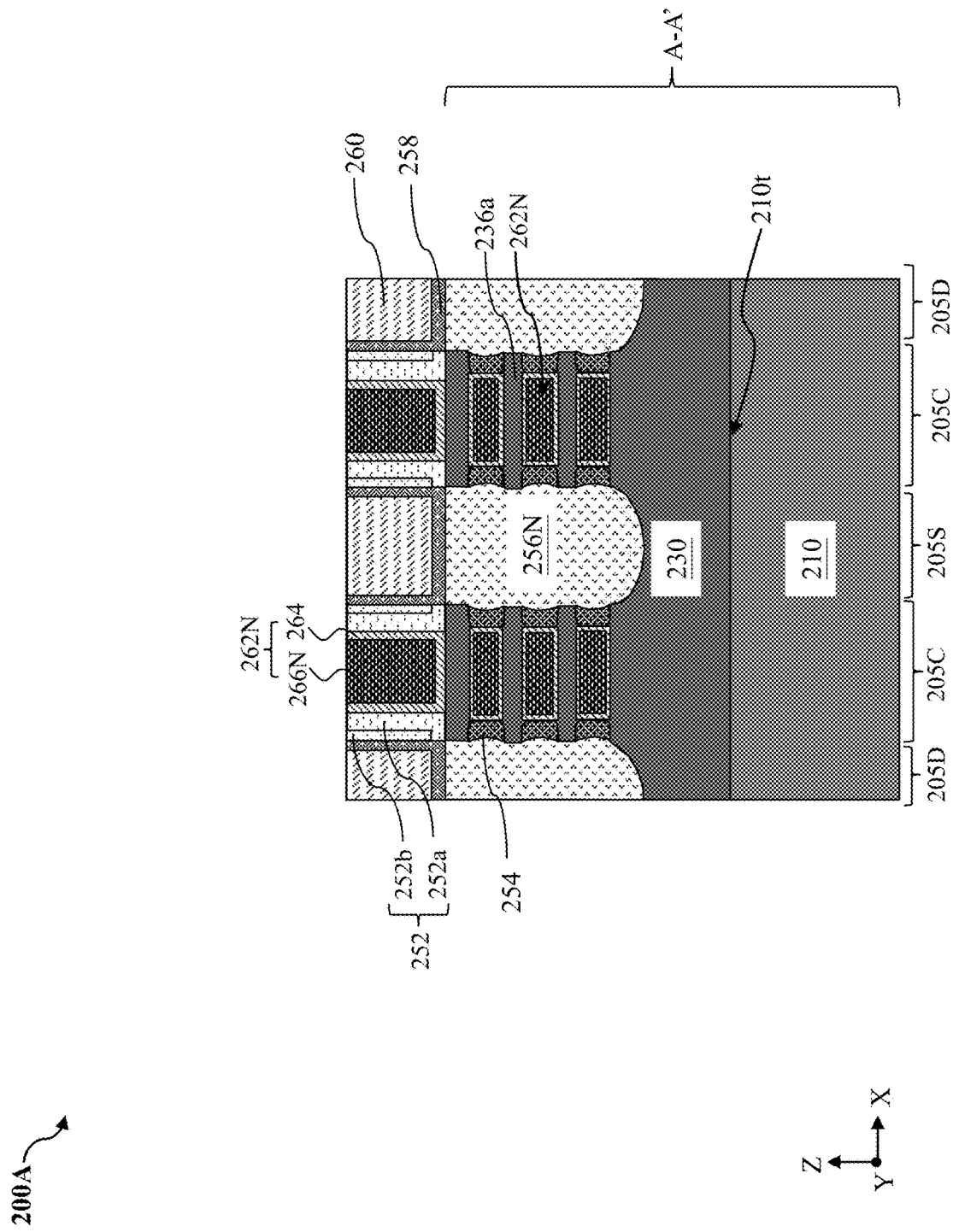
Figure 16:
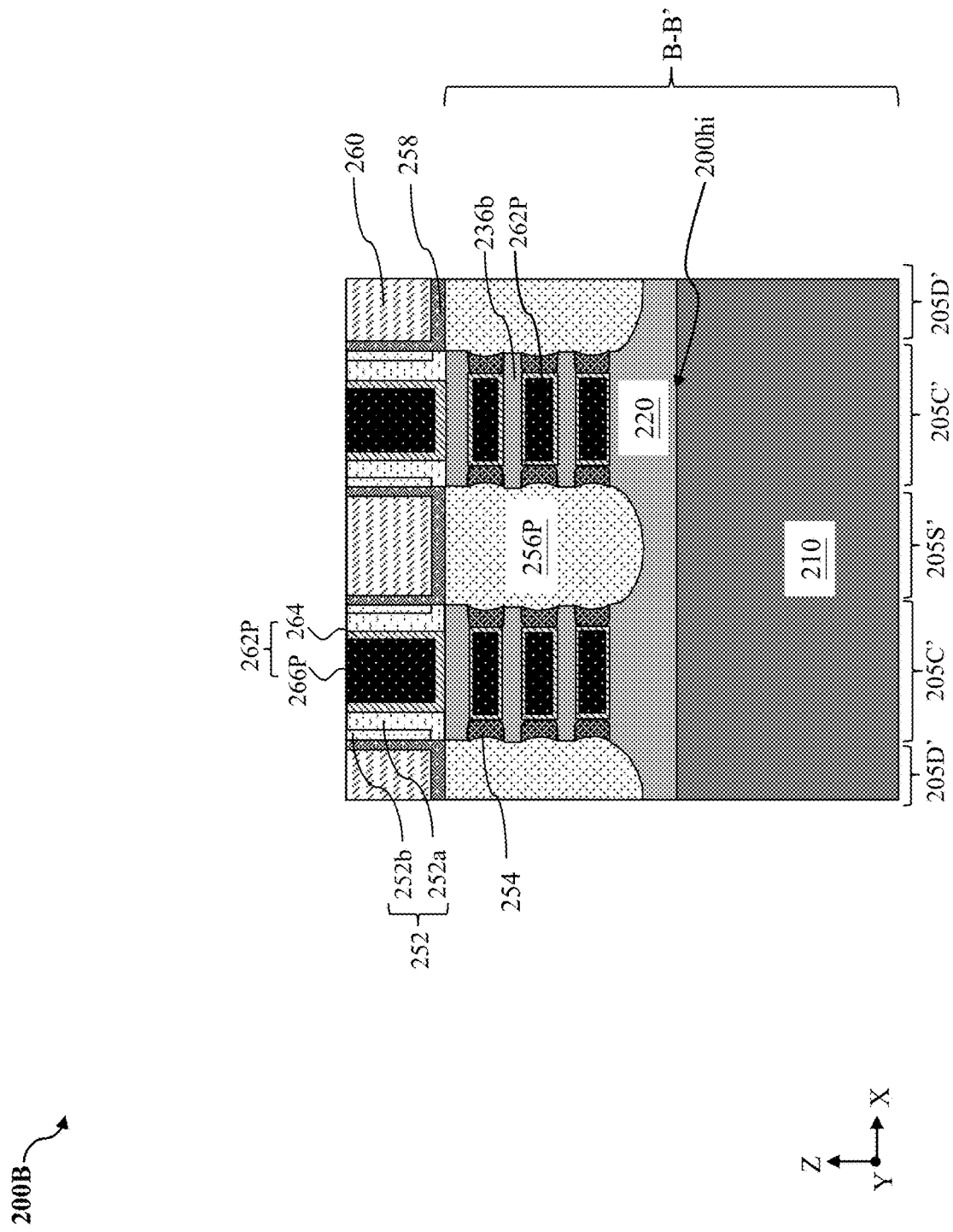

Referring to FIGS. 1 and 15-16, method 100 includes a block 120 where the dummy gate structures 245 are replaced with the gate stacks 262N in the first region 200A and gate stacks 262P in the second region 200B. The removal of the dummy gate structures 245 may include performing a planarization process (such as chemical mechanical polishing (CMP) process) to remove excess materials and expose top surfaces of the dummy gate electrode layer 247, performing one or more etching processes (such as a selective wet etch, a selective dry etch, or a combination thereof) that are selective to the material in the dummy gate structures 245. After the removal of the dummy gate structures 245, the sacrificial layers 234 are selectively removed to release the channel layers 236a as channel members 236a in the channel regions 205C and release the channel layers 236b as channel members 236b in the channel regions 205C'.

The gate stacks 262N are deposited in the first region 200A to wrap over the channel members 236a. The gate stacks 262P are deposited in the second region 200B to wrap over the channel members 236b. Each of the gate stacks 262N and 262P includes a gate dielectric layer 264. In some embodiments, the gate dielectric layer 264 includes an interfacial layer disposed on the channel members 236a/236b and a high-k dielectric layer over the interfacial layer. Here, a high-k dielectric layer refers to a dielectric material having a dielectric constant greater than that of silicon dioxide, which is about 3.9. A low-k dielectric layer refers to a dielectric material having a dielectric constant no greater than that of silicon dioxide. In some embodiments, the interfacial layer includes silicon oxide. The high-k dielectric layer is then deposited over the interfacial layer using ALD, CVD, and/or other suitable methods. The high-k dielectric layer may include hafnium oxide. Alternatively, the high-k dielectric layer may include other high-k dielectrics, such as titanium oxide, hafnium zirconium oxide, tantalum oxide, hafnium silicon oxide, zirconium silicon oxide, lanthanum oxide, aluminum oxide, yttrium oxide, $SrTiO_3$, $BaTiO_3$, BaZrO, hafnium lanthanum oxide, lanthanum silicon oxide, aluminum silicon oxide, hafnium tantalum oxide, hafnium titanium oxide, $(Ba,Sr)TiO_3$ (BST), silicon nitride, silicon oxynitride, combinations thereof, or other suitable material.

A gate electrode layer 266N is then deposited over the gate dielectric layer 264 in the first region 200A, and a gate electrode layer 266P is deposited over the gate dielectric layer 264 in the second region 200B. It is understood that, patterned film may be used to protect the first region 200A or the second region 200B during the formation of the gate electrode layer 266N and/or the gate electrode layer 266P to form gate stacks in corresponding regions. The gate electrode layer 266N and 266P each may include a single layer or alternatively a multi-layer structure, such as various combinations of a metal layer with a selected work function to enhance the device performance (work function metal layer), a liner layer, a wetting layer, an adhesion layer, a metal alloy or a metal silicide. Different work function metal layers for providing different n-type and p-type work function metal layers may be formed for the gate electrode layer 266N and the gate electrode layer 266P. A P-type work function metal may include tungsten carbon nitride, tantalum nitride, titanium nitride, titanium aluminum nitride, tungsten sulfur nitride, tungsten, cobalt, molybdenum, or other suitable materials. An N-type work function metal may include, but is not limited to, aluminum, titanium aluminum, titanium aluminum carbide, titanium aluminum silicon carbide, tantalum aluminum silicon carbide, hafnium carbide, or other suitable materials.

In embodiments represented in FIG. 14 and FIG. 15, for N-type MBC transistors formed in the first region 200A, the source/drain features 256N and channel layers 236a are formed over the epitaxial semiconductor layer 230. The source/drain features 256N and/or channel layers 236a thus have top surfaces in (100) crystal plane. This (100) crystal plane may help improve the electron mobility and thus improve the performance of the N-type MBC transistors. In embodiments represented in FIG. 14 and FIG. 16, for P-type MBC transistors formed in the second region 200B, the source/drain features 256P and channel layers 236b are formed over the second wafer 220. The source/drain features 256P and/or channel layers 236b may have top surfaces in (110) crystal plane. This (110) crystal plane may help improve the hole mobility and thus improve the performance of the P-type MBC transistors. Therefore, both N-type MBC transistors and P-type MBC transistors are formed over respective optimum crystal plane.

Referring to FIGS. 1 and 15-16, method 100 includes a block 122 where further processes may be performed to complete the fabrication of the semiconductor structure 200. For example, such further processes may form various contacts/vias, metal lines, power rails, as well as other multilayer interconnect features, such as ILD layers and/or etch stop layer (ESLs) over the semiconductor structure 200, configured to connect the various features to form a functional circuit that includes the different semiconductor devices.

In the above described embodiments, the second wafer 220 disposed over the first wafer 210. In some implementations, the first wafer 210 may be formed over the second wafer 220 to accommodate various fabrication conditions. For example, FIGS. 17-21 illustrate a first alternative embodiment of forming a semiconductor structure, according to one or more aspects of the present disclosure.

Figure 17:
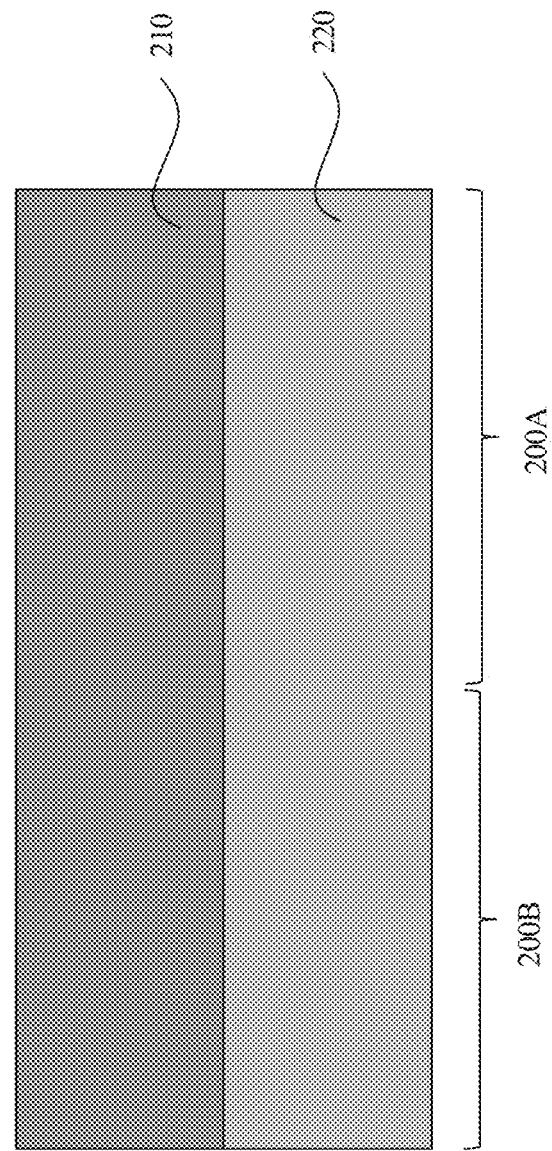
FIGS. 17-21 illustrate a first alternative embodiment of forming a semiconductor structure, according to one or more aspects of the present disclosure.

Referring to FIG. 1 and FIG. 17, method 100 includes the block 102 where the first wafer 210 is bonded to the second wafer 220. As described above, the first wafer 210 is a bulk silicon wafer and a top surface of the first wafer 210 has the (100) crystal plane. The second wafer 220 is a bulk silicon wafer and a top surface of the second wafer 220 has the (110) crystal plane. The first wafer 210 is bonded with and disposed over the second wafer 220. The workpiece 300 shown in FIG. 17 also includes a first region 200A where N-type MBC transistors are to be formed and a second region 200B where P-type MBC transistors are to be formed.

Figure 18:
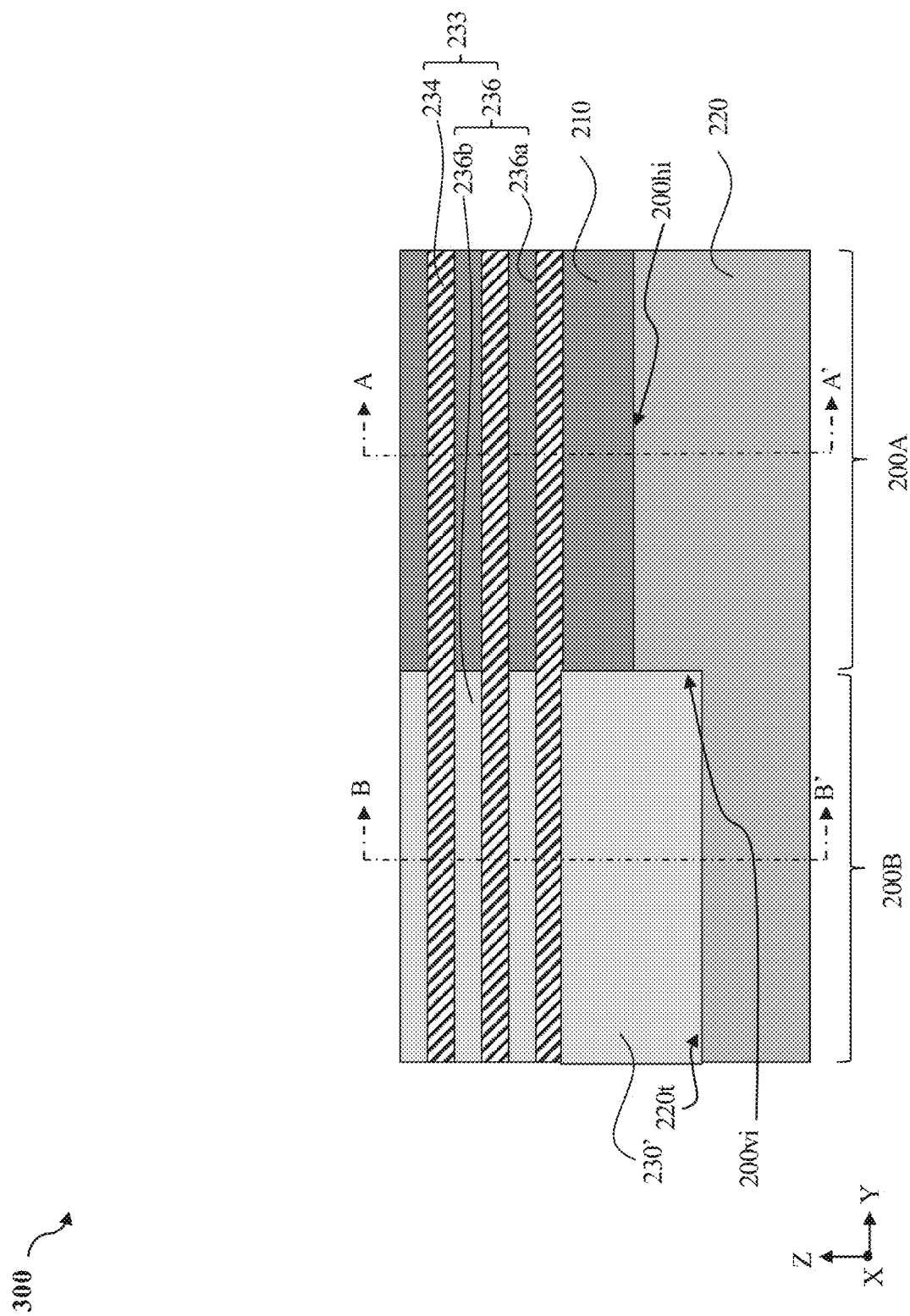

After providing the workpiece 300 shown in FIG. 17, similar processes (e.g., thinning the upper wafer, patterning the upper wafer and lower wafer to form a trench, and epitaxially growing a semiconductor layer in the trench) in blocks 104, 106, 108 and 110 in method 100 (e.g., described above with reference to FIGS. 3-6) may be performed to form the workpiece 300 shown in FIG. 18. In this depicted example, an epitaxial semiconductor layer 230' is formed directly over the top surface 220t of the second wafer 220, and a top surface of the epitaxial semiconductor layer 230' has a (110) crystal plane. The formation the epitaxial semiconductor layer 230' on the top surface 220t may be in a way similar to that of the epitaxial semiconductor layer 230 on the top surface 210t. In an embodiment, the epitaxial semiconductor layer 230' is formed of silicon.

Referring to FIG. 1 and FIG. 18, method 100 includes a block 112 where a vertical stack 233 of alternating sacrificial layers 234 and channel layers 236 is epitaxially grown over the epitaxial semiconductor layer 230' in the second region 200B and the first wafer 210 in the first region 200A. It is noted that, the channel layers 236 formed over the first region 200A (may also be referred to as channel layers 236a) has the same crystal orientation as the first wafer 210, and the channel layers 236 formed over the second region 200B (may also be referred to as channel layers 236b) has the same crystal orientation as the epitaxial semiconductor layer 230'. That is, top surfaces of the channel layers 236a include a (100) crystal plane and top surfaces of the channel layers 236b include a (110) crystal plane.

Figure 19:
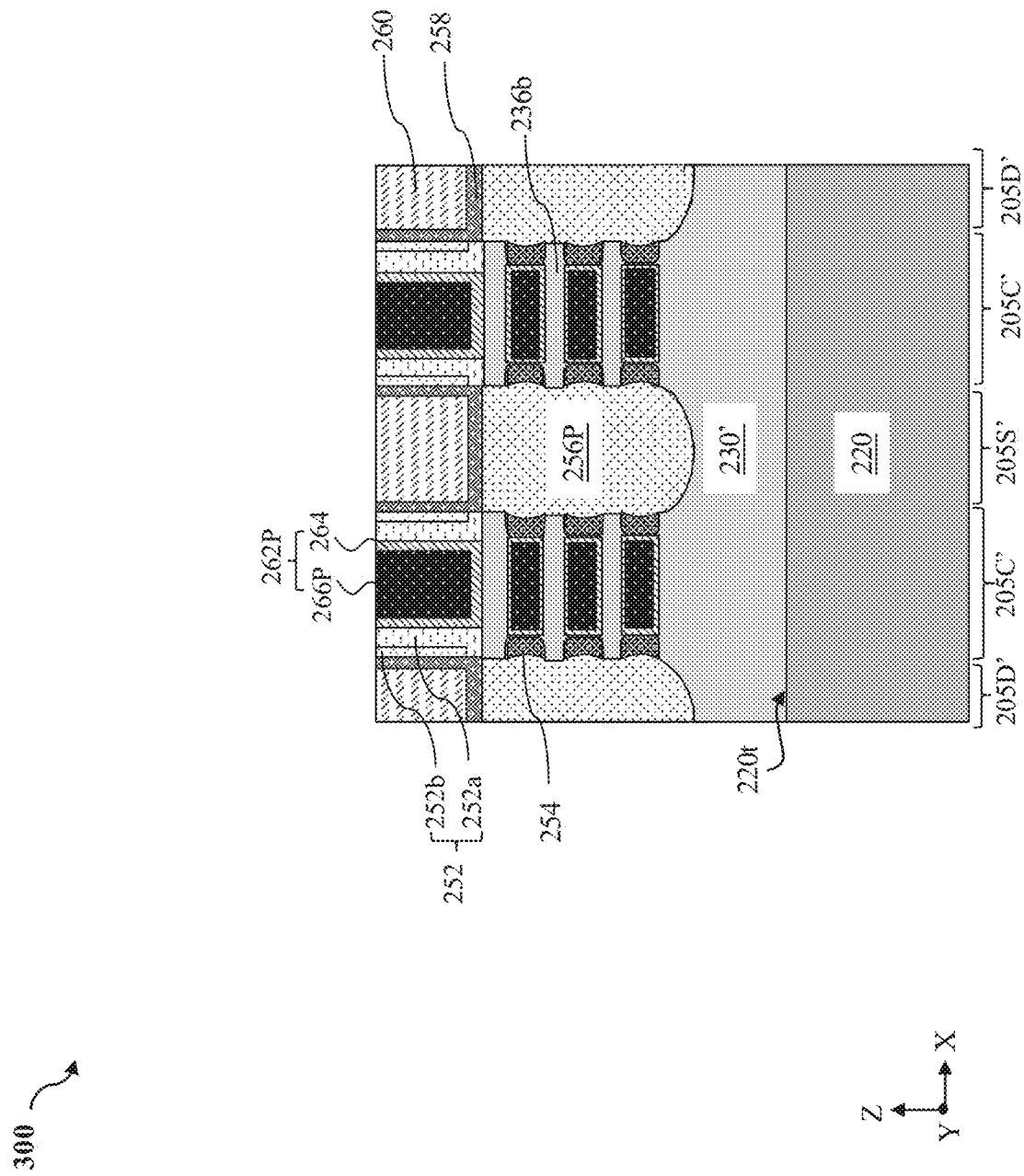
Figure 20:
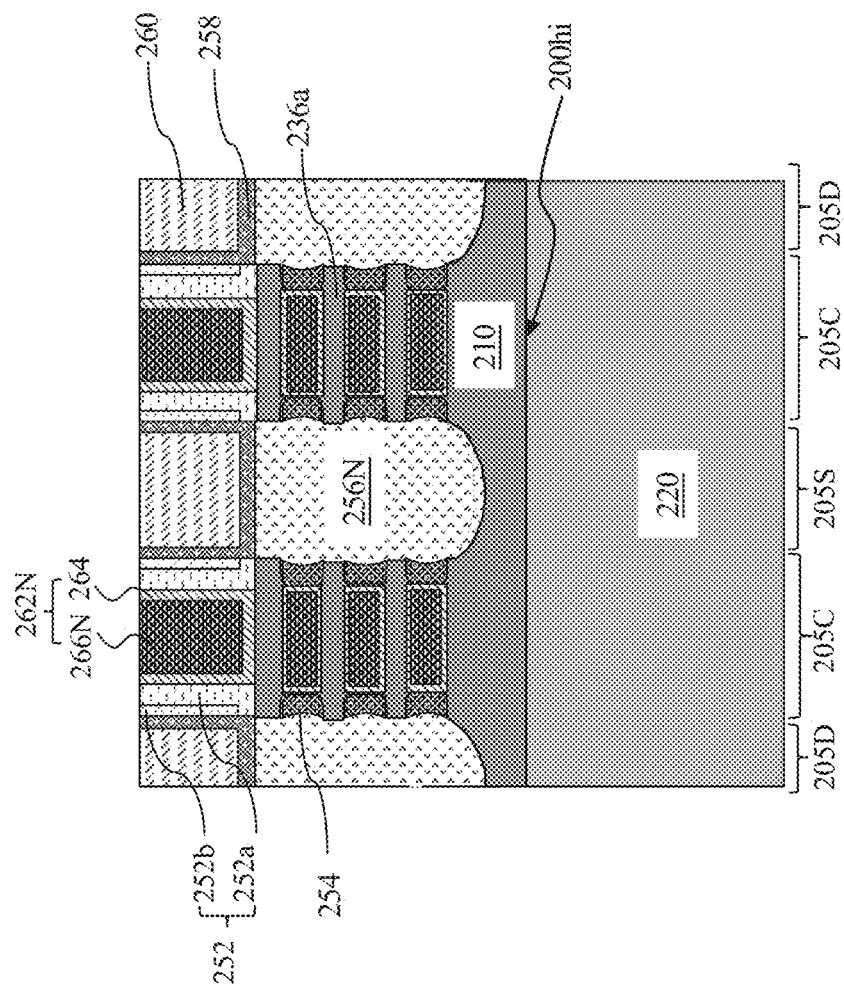
Figure 21:
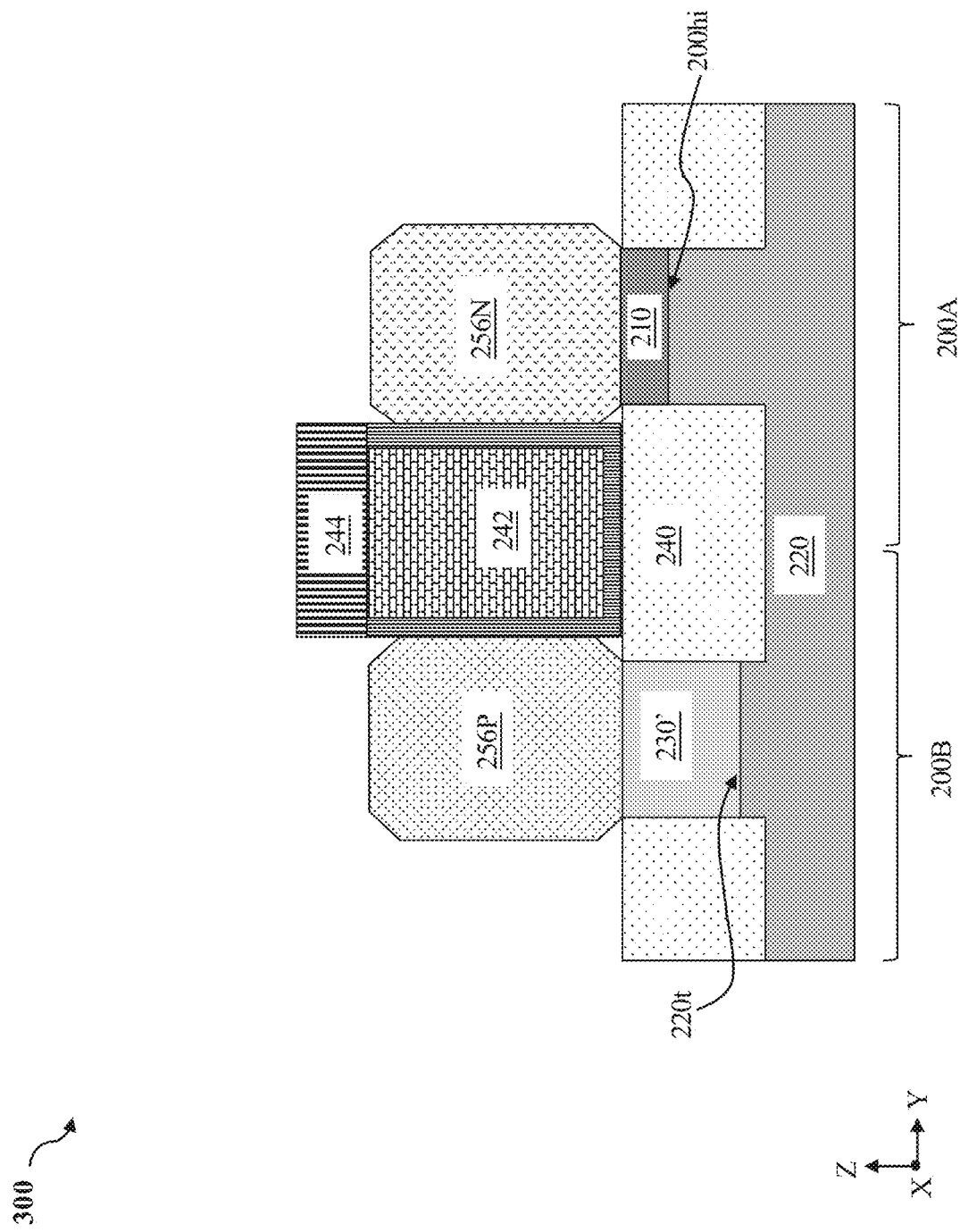

After forming the vertical stack 233, operations in block 114, 116, 118, and 120 of method 100 may be performed to form the P-type MBC transistors in the second region 200B and N-type MBC transistors in the first region 200A. FIG. 19 depicts a fragmentary cross-sectional view of a P-type MBC transistors taken along line B-B' in FIG. 18. In embodiments represented in FIG. 19, the source/drain features 256P are in direct contact with the channel layers 236b and disposed directly over the epitaxial semiconductor layer 230' formed over the second wafer 220. FIG. 20 depicts a fragmentary cross-sectional view of an N-type MBC transistors taken along line A-A' in FIG. 18. In embodiments represented in FIG. 20, the source/drain features 256N are in direct contact with the channel layers 236a and disposed directly over the first wafer 210. A vertical distance between the bottommost channel layer of the channel layers 236b and the second wafer 220 in the second region 200B is greater than a vertical distance between the bottommost channel layer of the channel layers 236a and the second wafer 220 in the first region 200A. Descriptions of features of the workpiece 300 similar to those of the workpiece 200 are omitted for reason of simplicity.

Figure 22:
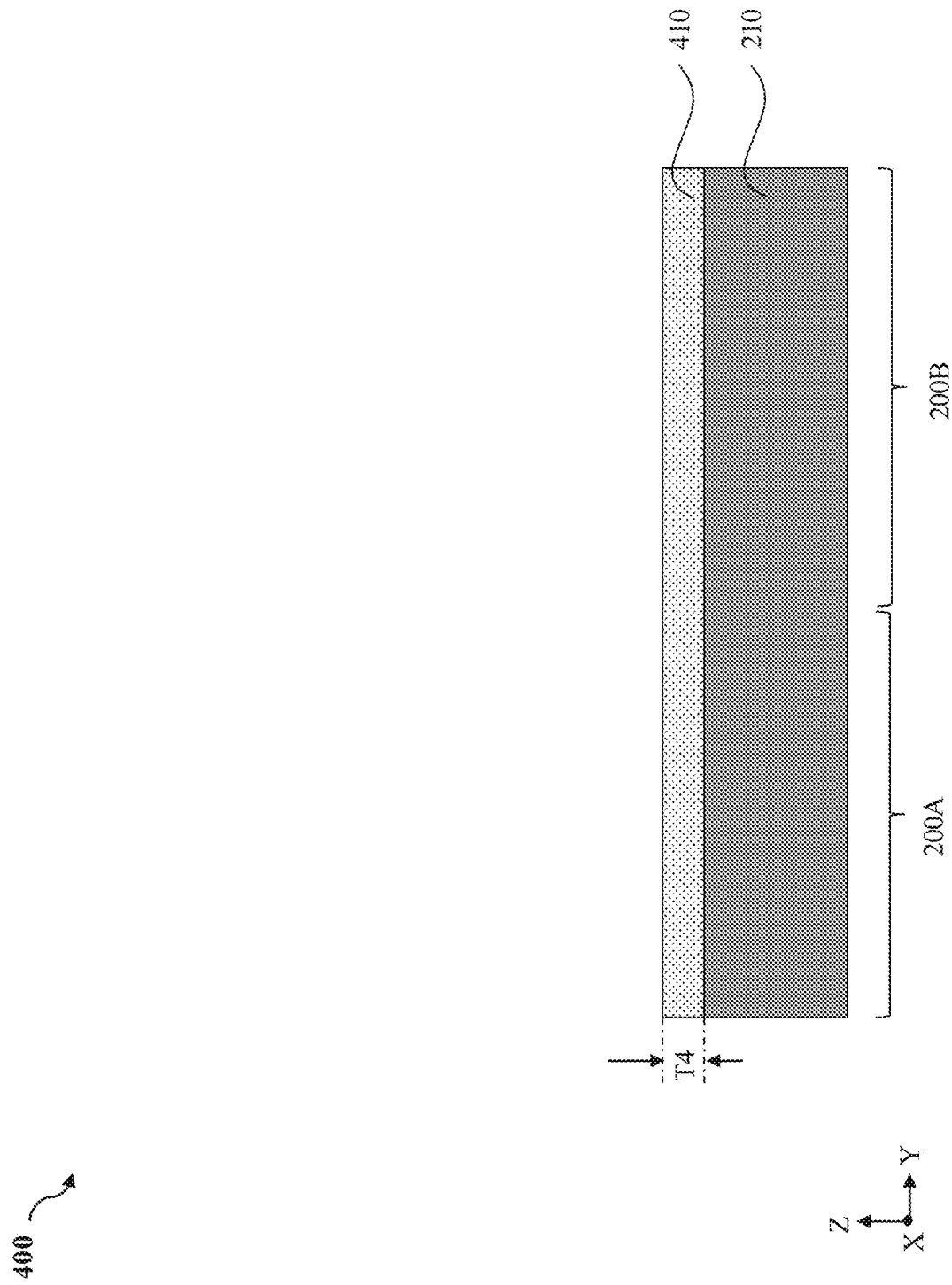
FIGS. 22-27 illustrate a second alternative embodiment of forming a semiconductor structure, according to one or more aspects of the present disclosure.

In some implementations, before bonding, an oxide layer 410 may be formed over the bottom wafer to reduce current leakage in transistors formed over at least one region of the hybrid substrate. For example, FIGS. 22-27 illustrate a second alternative embodiment of forming a semiconductor structure, according to one or more aspects of the present disclosure. Referring to FIG. 1 and FIG. 22, the method 100 includes, before performing operations in block 102, forming an oxide layer 410 over the first wafer 210 before bonding the second wafer 220 with the first wafer 210. The oxide layer 410 may be formed by an oxidation process (such as thermal oxidation or chemical oxidation) where the top surface of the first wafer 210 reacts with oxygen to form a semiconductor oxide as the oxide layer 410. In some embodiments, a deposition process may be used to form the oxide layer 410. The oxide layer 410 has a thickness T4 along the Z direction. In some embodiments, T4 may be between about 10 nm and about 50 nm to advantageously reduce leakage current without substantially affecting the dimensions of the transistors.

Figure 23:
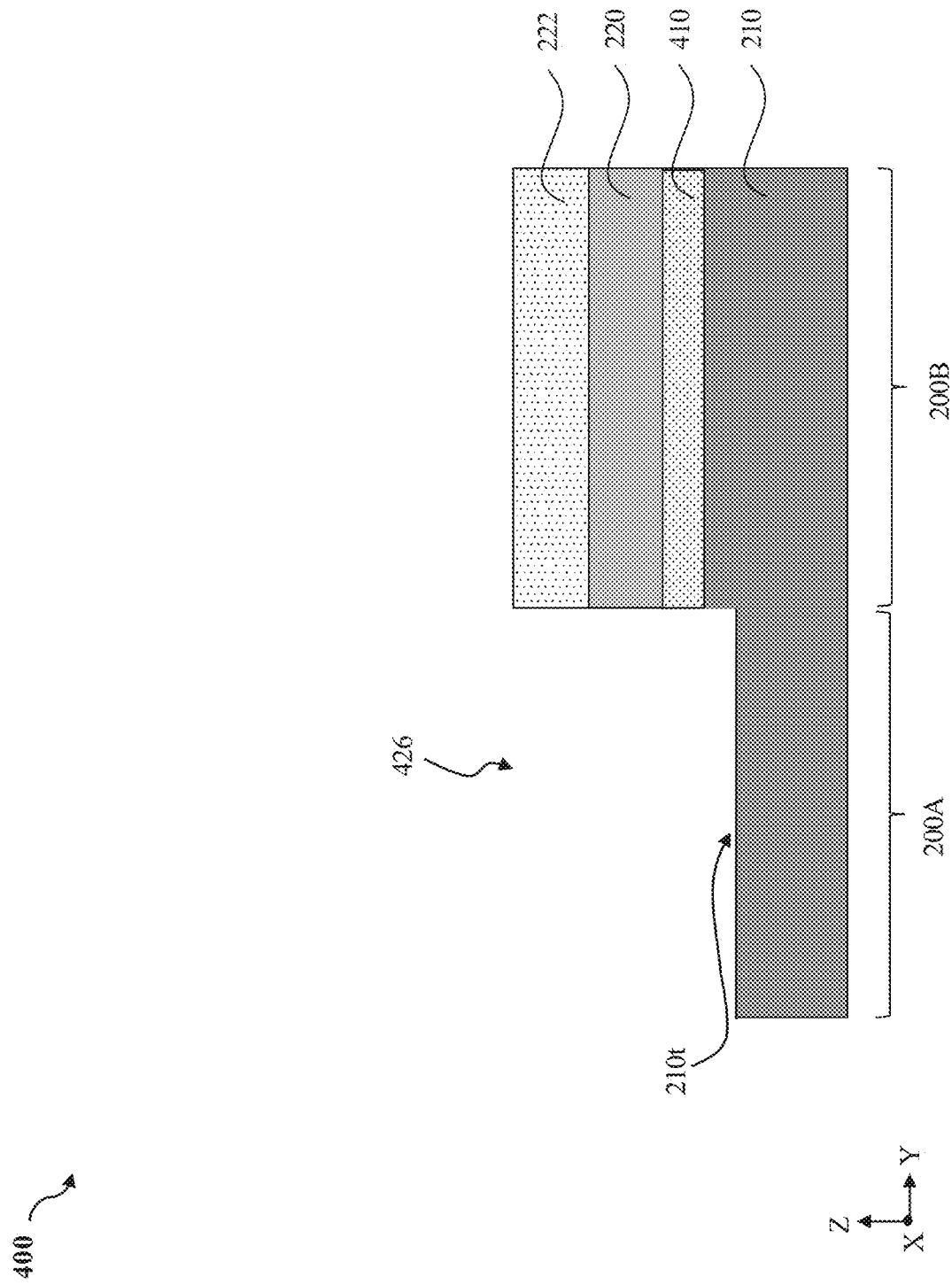

Referring to FIGS. 1 and 23, after forming the oxide layer 410 over the first wafer 210, the method 100 proceed to block 102, 104, 106 and 108 described above with reference to FIGS. 2-5. The second wafer 220 is bonded to the oxide layer 410 and thinned. That is, the second wafer 220 is spaced apart from the first wafer 210 by the oxide layer 410. The workpiece 400 is then patterned to remove portions of the second wafer 220 and oxide layer 410 in the first region 200A and a portion of the first wafer 210 in the first region 200A. After block 108, a trench 426 is formed over the first region 200A. As shown in FIG. 23, the trench 426 exposes the top surface 210t of the first wafer 210 in the first region 200A. Sidewalls of the first wafer 210, the oxide layer 410, and the second wafer 220 in the second region 200B define a sidewall of the trench 426.

Figure 24:
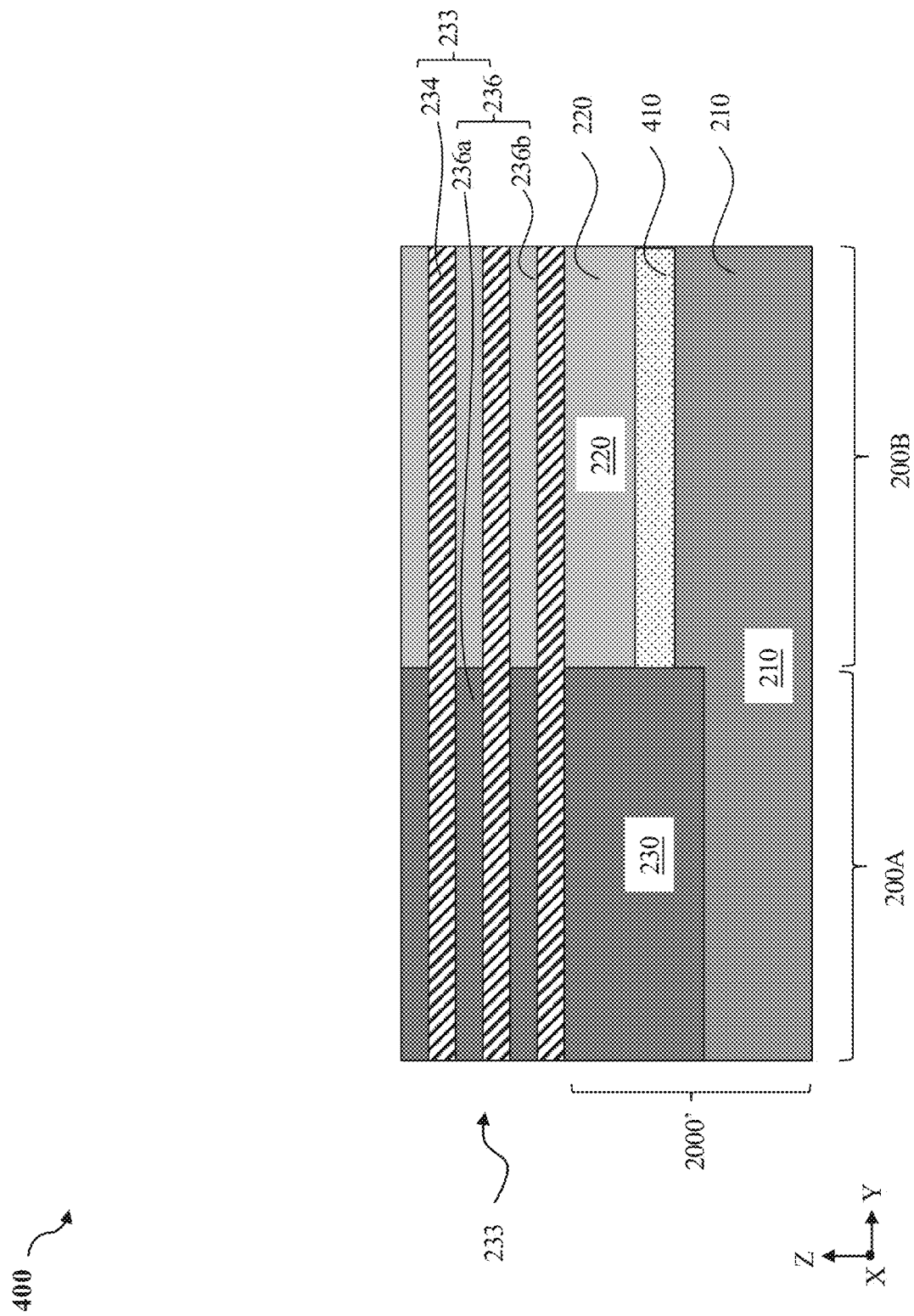

Referring to FIGS. 1 and 24, the epitaxial semiconductor layer 230 is formed in the trench 426 and on the top surface 210t. In the embodiments represented in FIG. 24, the hybrid substrate 2000' includes the first region 200A and the second region 200B. Different from the hybrid substrate 2000 described with reference to FIG. 6, in the second region 200B of the hybrid substrate 2000', the oxide layer 420 is disposed between the second wafer 220 and the first wafer 210. The method 100 then proceeds to block 112 where the vertical stack 233 is formed over the hybrid substrate 2000'.

Figure 25:
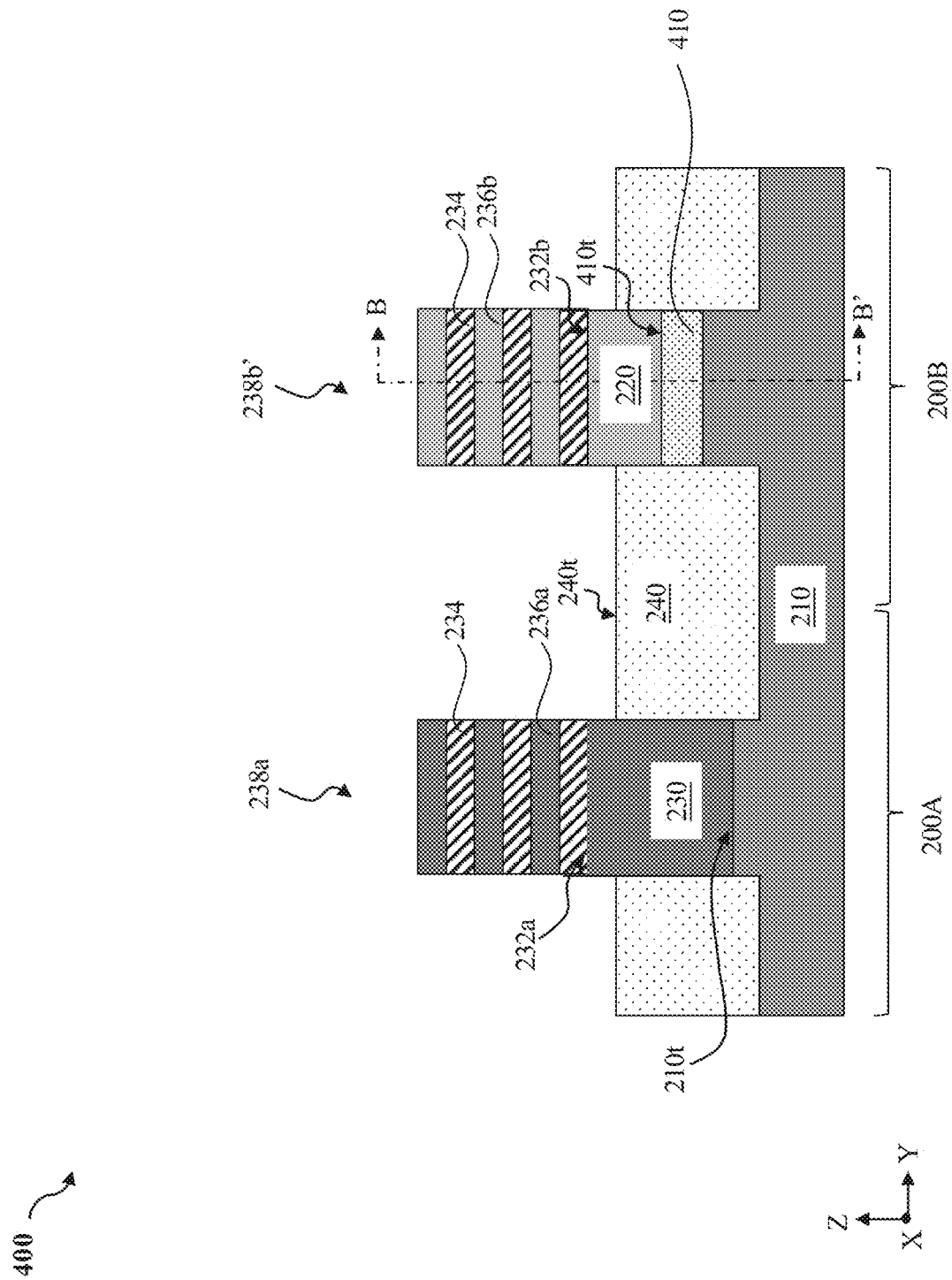

Referring to FIGS. 1 and 25, the method 100 includes a block 114 where the vertical stack 233 and the hybrid substrate 2000' are patterned to form fin-shaped structures such as the fin-shaped structures 238a and 238b'. The fin-shaped structure 238a shown in FIG. 25 may be in a way similar to the fin-shaped structure 238a described with reference to FIG. 8. That is, the fin-shaped structure 238a formed in the first region 200A includes the channel layers 236a, the sacrificial layers 234, the epitaxial semiconductor layer 230, and a portion of the first wafer 210. In the present embodiment, the fin-shaped structure 238b' formed in the second region 200B includes the channel layers 236b, the sacrificial layers 234, the second wafer 220, the oxide layer 410, and the first wafer 210.

Figure 26:
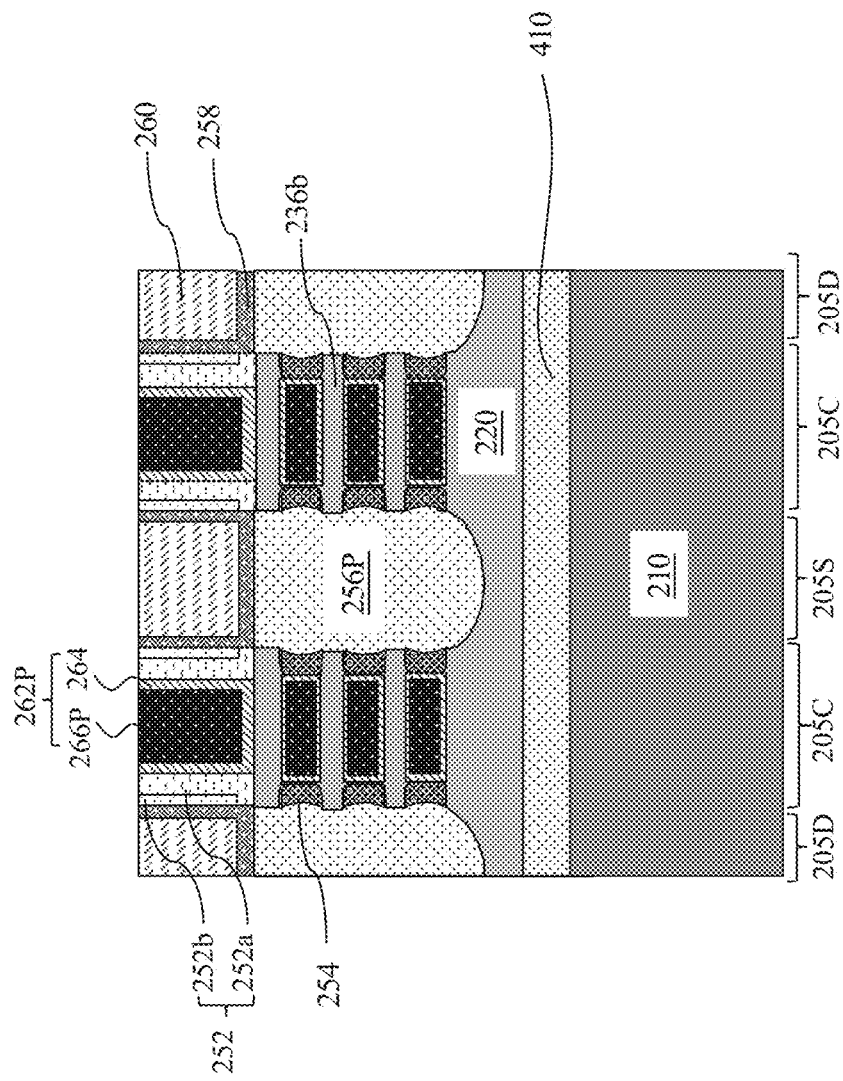
Figure 27:
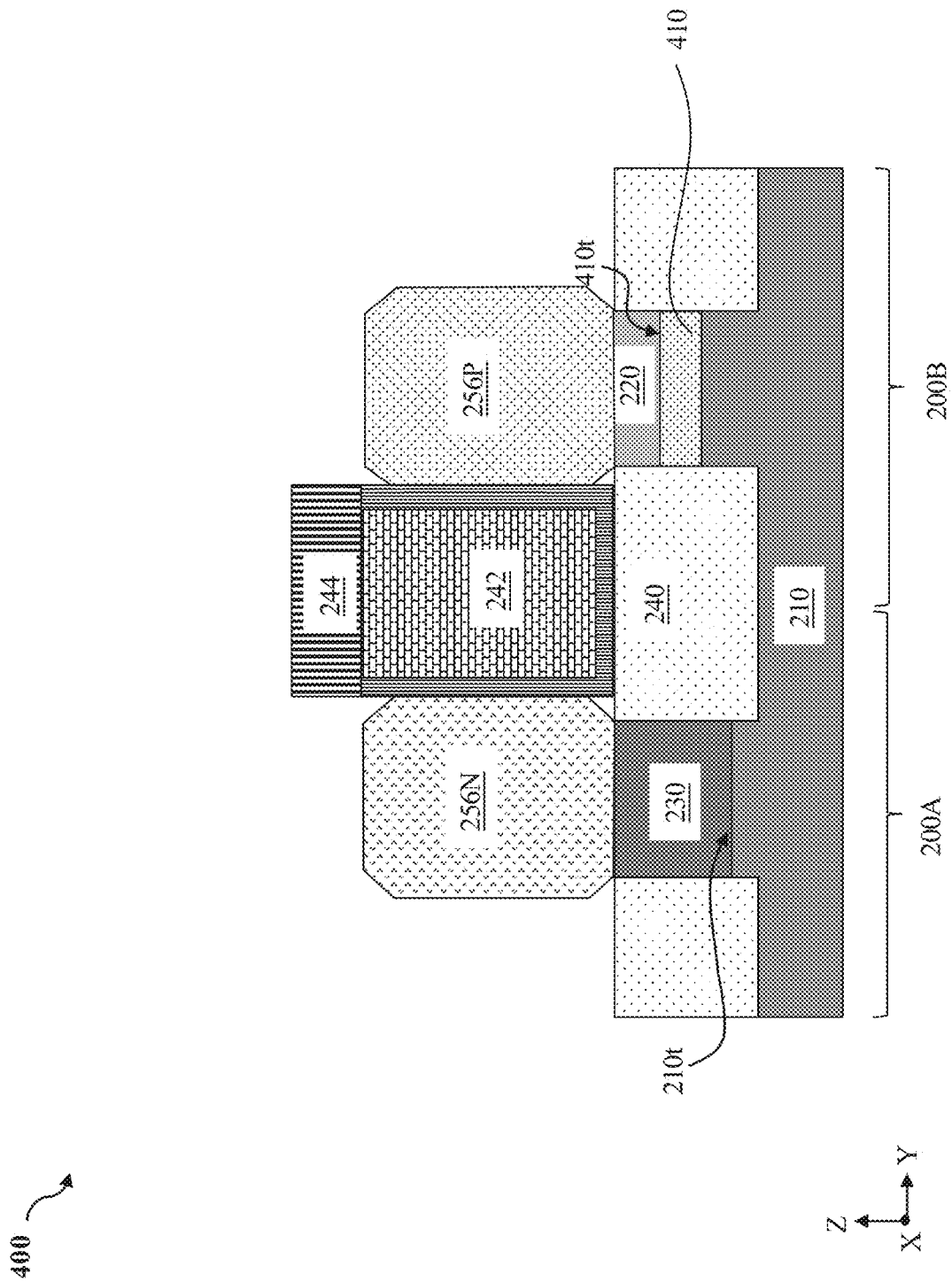

Referring to FIGS. 1 and 26-27, the method 100 proceeds to block 116, 118, 120, and 122 in method 100. STI features 240 are formed over the workpiece 400. In some embodiments, a composition of the STI features 240 may be different from the composition of the oxide layer 410. In other implementations, both the STI features 240 and the oxide layer 410 may be formed of silicon oxide, and the oxide layer 410 may be denser than the STI features 240. In the present embodiment, the bottom surface of the STI feature 240 is lower than the bottom surface of the oxide layer 410. In this depicted example, the bottom surface of the oxide layer 410 is also higher than the top surface 210t. A top surface 410t of the oxide layer 410 is lower than a top surface 240t of the STI feature 240, and the top surface 240t of the STI feature 240 is lower than the first top surface 232a of the epitaxial semiconductor layer 230. It is noted that, after forming the fin-shaped structures, the oxide layer 410 is formed in the second region 200B, and the first region 200A doesn't include the oxide layer 410.

FIG. 26 depicts a fragmentary cross-sectional view of the workpiece 400 taken along line B-B' shown in FIG. 25 after replacing the dummy gate structures with the gate stacks. As shown in FIG. 26, in the second region 200B, the second wafer 220 is spaced apart from the first wafer 210 by the oxide layer 410. The N-type MBC transistor formed over the first region 200A of workpiece 400 may be in a way similar to that of the workpiece 200 and thus the description of the N-type MBC transistor is omitted for reason of simplicity. By forming the oxide layer 410, current leakages in the P-type MBC transistors may be advantageously reduced. FIG. 27 depicts a fragmentary cross-sectional view of the workpiece 400 when viewed along the X direction. The source/drain features 256N are formed directly over the epitaxial semiconductor layer 230, and the source/drain features 256P are formed directly over the second wafer 220 disposed on the oxide layer 410.

Figure 28:
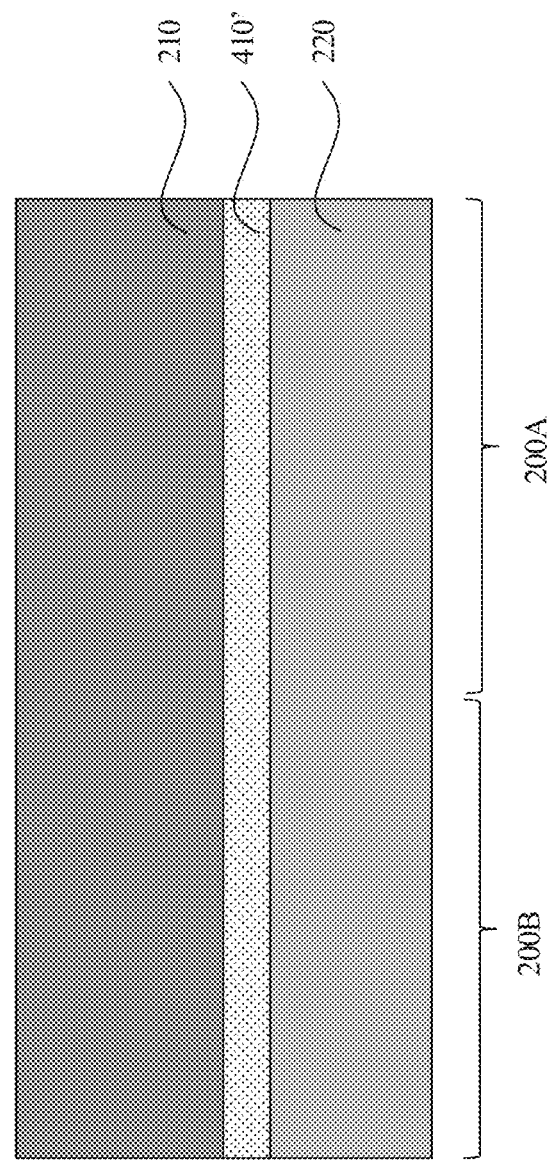
FIGS. 28-31 illustrate a third alternative embodiment of forming a semiconductor structure, according to one or more aspects of the present disclosure.
Figure 29:
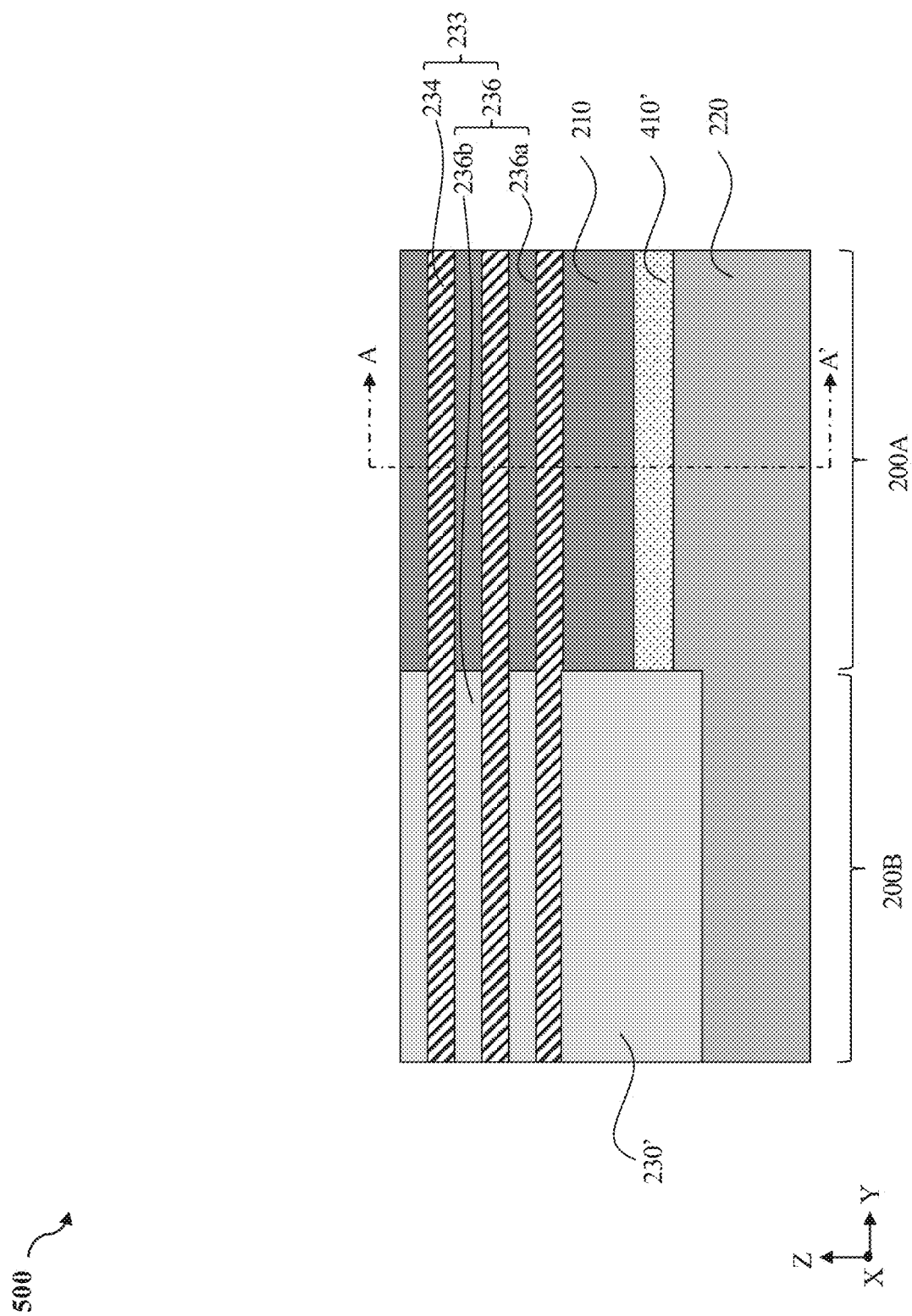
Figure 30:
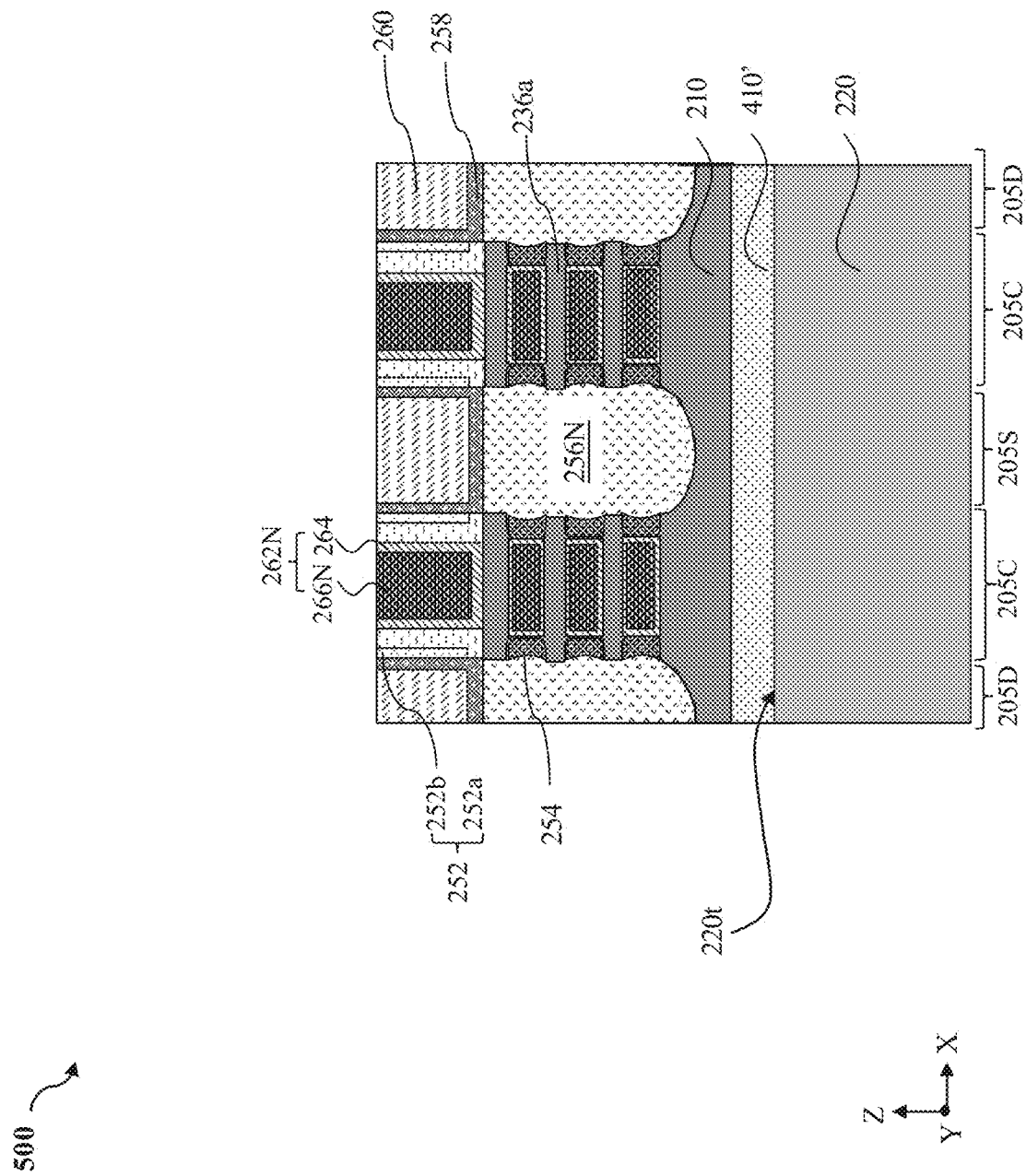
Figure 31:
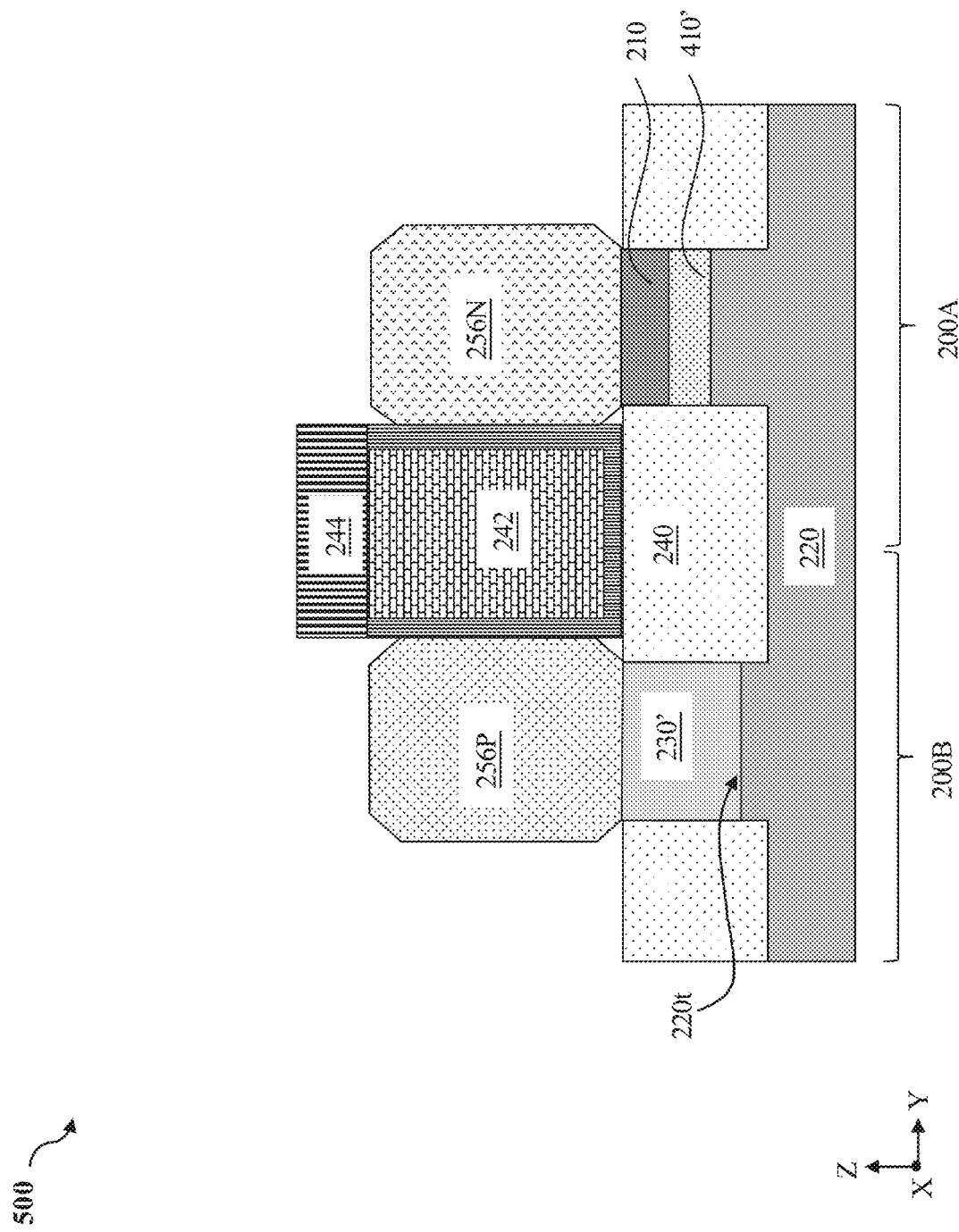

In some implementations, the current leakages in the N-type MBC transistors may be advantageously reduced. FIGS. 28-31 illustrate a third alternative embodiment of forming a semiconductor structure 500, according to one or more aspects of the present disclosure. The method 100 includes forming an oxide layer 410' over the second wafer 220 and bonding the first wafer 210 to the oxide layer 410', as shown in FIG. 28. The first wafer 210 is disposed on the oxide layer 410' and is spaced apart from the second wafer 220 by the oxide layer 410'. The formation of the oxide layer 410' may be in a way similar to that of the oxide layer 410 such as by oxidizing the second wafer 220. The operations in blocks 104, 106, 108, 110, and 112 in method 100 as described above are then performed. As shown in FIG. 29, the vertical stack 233 of alternating sacrificial layers 234 and channel layers 236 are formed over the workpiece 200. The operations in blocks 114, 116, 118, 120, 122 in method 100 are then performed. FIG. 30 depicts a fragmentary cross-sectional view of the workpiece 400 taken along line A-A' shown in FIG. 29 after replacing the dummy gate structures with the gate stacks. As shown in FIG. 30, in the first region 200A, the first wafer 210 is spaced apart from the second wafer 220 by the oxide layer 410'. The P-type MBC transistors formed over the second region 200B of workpiece 500 may be in a way similar to that of the workpiece 300 and thus related description is omitted for reason of simplicity. By forming the oxide layer 410', current leakages in the N-type MBC transistors may be advantageously reduced. FIG. 31 depicts a fragmentary cross-sectional view of the workpiece 500 when viewed along the X direction. The source/drain features 256P are formed directly over the epitaxial semiconductor layer 230', and the source/drain features 256N are formed directly over the first wafer 210 disposed on the oxide layer 410'.

As semiconductor devices continue to scale down, challenges also arise in achieving desired density. Reducing the spacing S1 between two adjacent fin-shaped structures may improve the density. FIGS. 32-37 illustrate a fourth alternative embodiment of forming a semiconductor structure, according to one or more aspects of the present disclosure.

Figure 32:
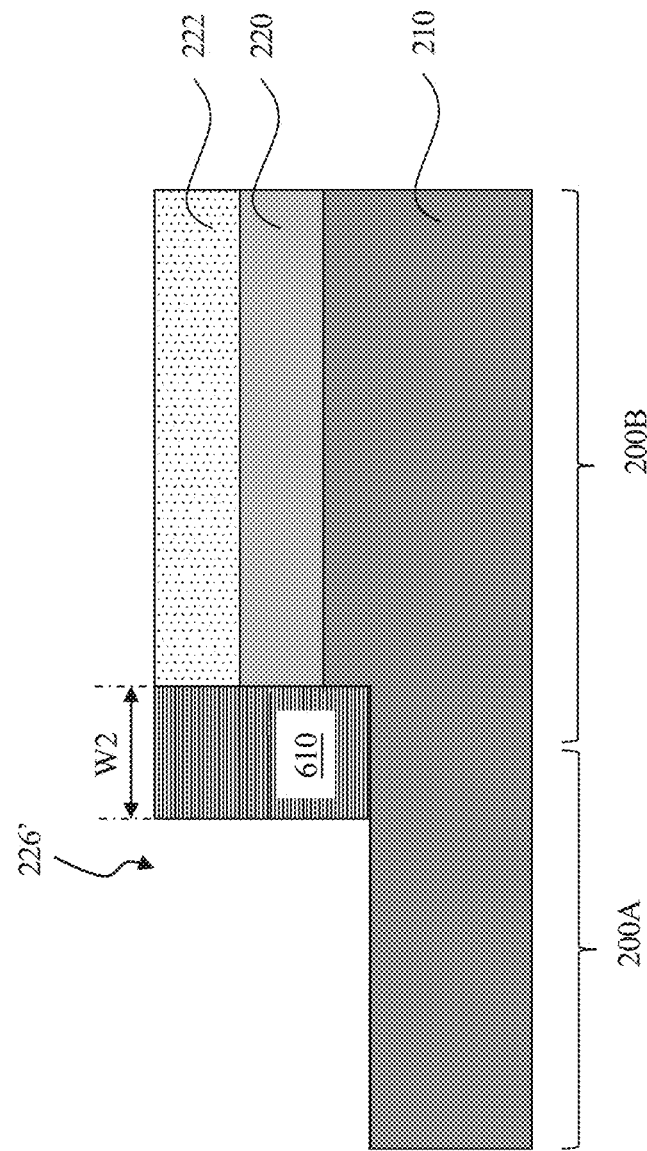
FIGS. 32-37 illustrate a fourth alternative embodiment of forming a semiconductor structure, according to one or more aspects of the present disclosure.

Referring to FIGS. 1 and 32, after forming the trench 226 (shown in FIG. 5), a dielectric spacer layer is conformally formed over the surfaces of workpiece and etched back to form a dielectric spacer 610 extending along the sidewall of the trench 226. The trench 226 partially filled by the dielectric spacer 610 may be also referred to as trench 226'. In some embodiments, the dielectric spacer 610 may be formed of silicon oxide, silicon nitride, silicon oxynitride, combinations thereof, or other suitable materials. In an embodiment, the dielectric spacer 610 includes silicon oxide formed by ALD. The width W2 of the dielectric spacer 610 along the Y direction is smaller than the spacing S1 (shown in FIG. 8). In an embodiment, a width W2 of the dielectric spacer 610 along the Y direction may be between about 5 nm and about 50 nm to provide enough isolation between two adjacent fin-shaped structures while increasing the density.

Figure 33:
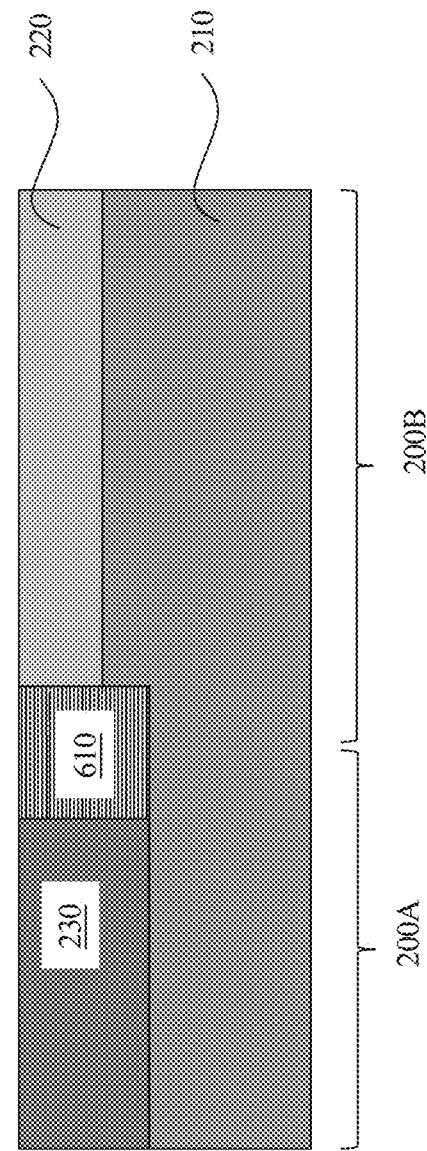
Figure 34:
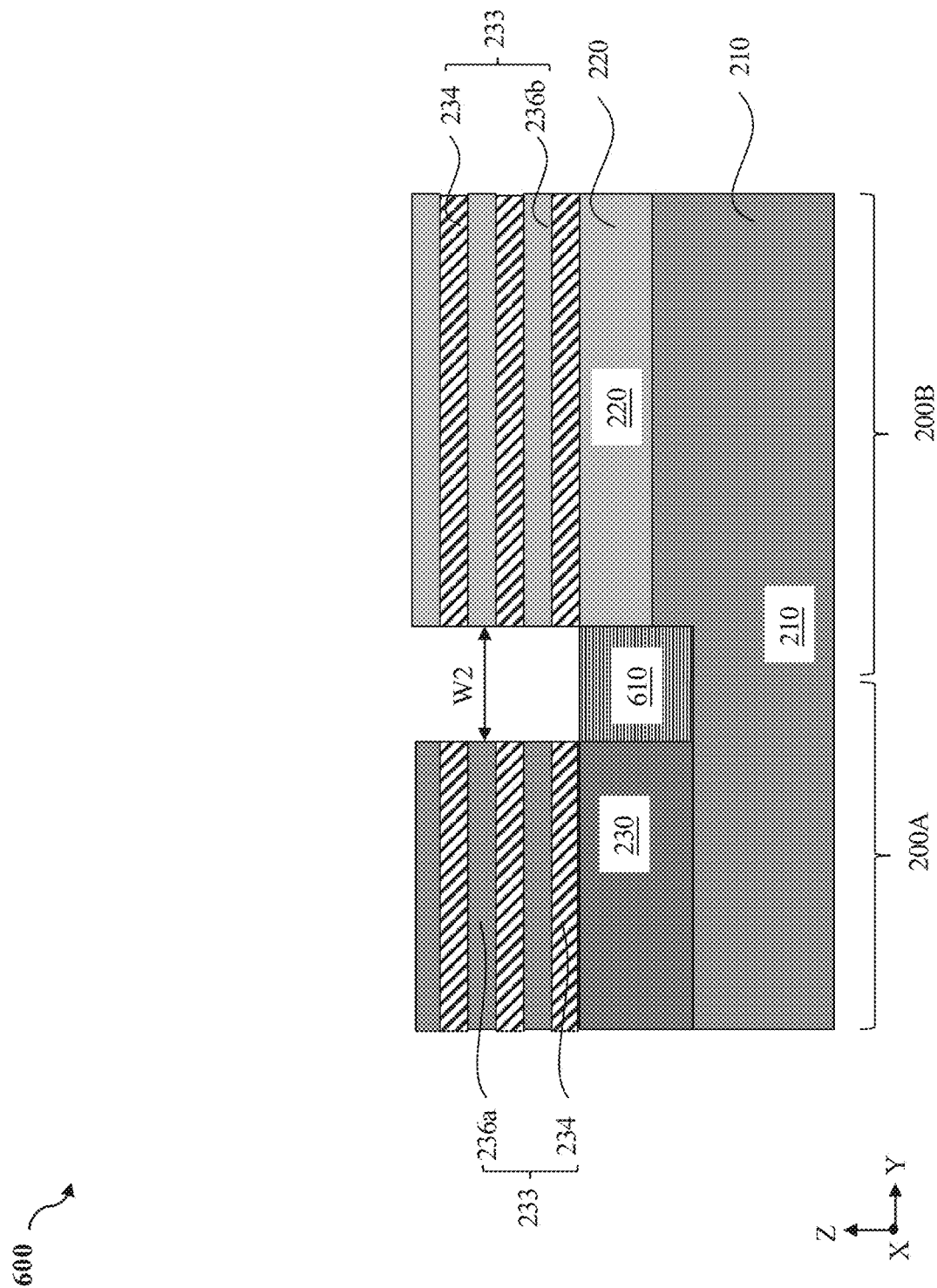

Referring to FIG. 1 and FIG. 33, the method 100 proceeds to block 110 where the epitaxial semiconductor layer 230 is formed in the trench 226'. The epitaxial growth of the epitaxial semiconductor layer 230 may be controlled to stop when a top surface of the epitaxial semiconductor layer 230 is higher than a top surface of the second wafer 220. After the epitaxial growth, a planarization process (e.g., CMP) may be performed such that the top surface of the dielectric spacer 610 is exposed and the top surface of the epitaxial semiconductor layer 230 is coplanar with the top surface of the second wafer 220. Referring to FIG. 1 and FIG. 34, the method 100 proceeds to block 112 where the vertical stack 233 of alternating sacrificial layers 234 and channel layers 236 are epitaxially formed over the workpiece 600. As shown in FIG. 34, the vertical stack 233 is not formed on the dielectric spacer 610.

Figure 35:
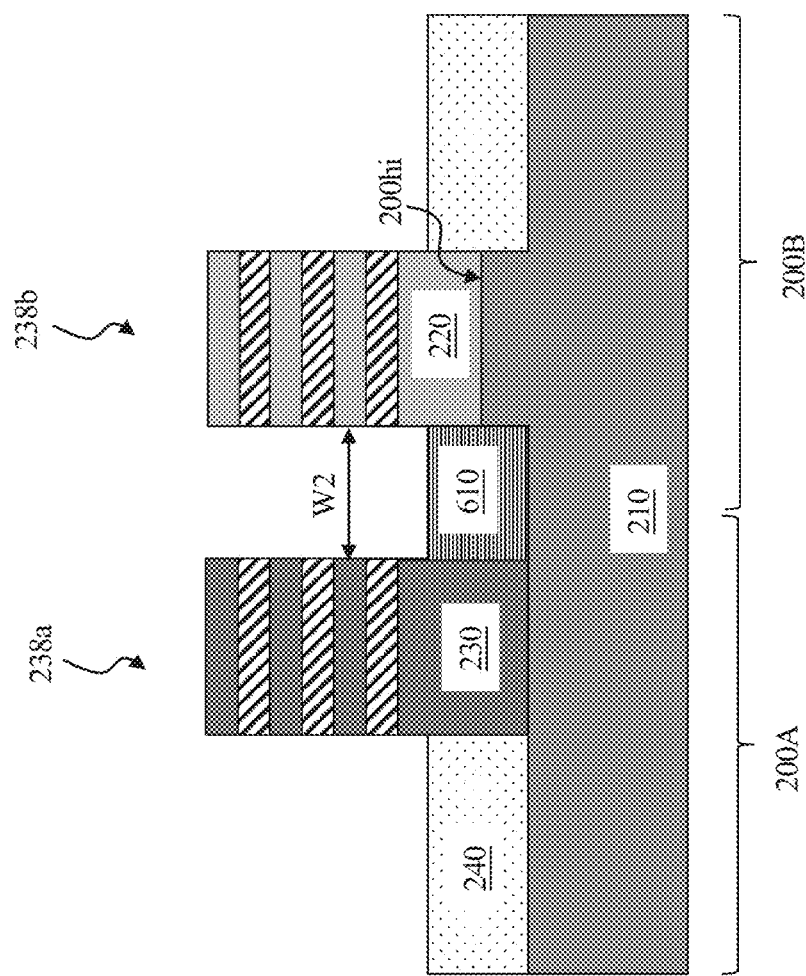

The method 100 then proceeds to block 114 where the vertical stack 233 is patterned to form fin-shaped structures. As shown in FIG. 35, the fin-shaped structure 238a is spaced apart from the fin-shaped structure 238b by a spacing equal to the width W2 of the dielectric spacer 610. Since the width W2 is smaller than the spacing S1 (shown in FIG. 8) along the Y direction, the device density may be increased. In an embodiment, a ratio of W2 to S1 (i.e., W2/S1) may be between about 0.3 and about 0.6 to reduce the spacing between two adjacent fin-shaped structures without substantially affecting the isolation between two adjacent source/drain features 256N and 256P. In an embodiment, a bottom surface and a top surface of the dielectric spacer 610 are coplanar with a bottom surface and a top surface of the STI feature 240, respectively.

Figure 36:
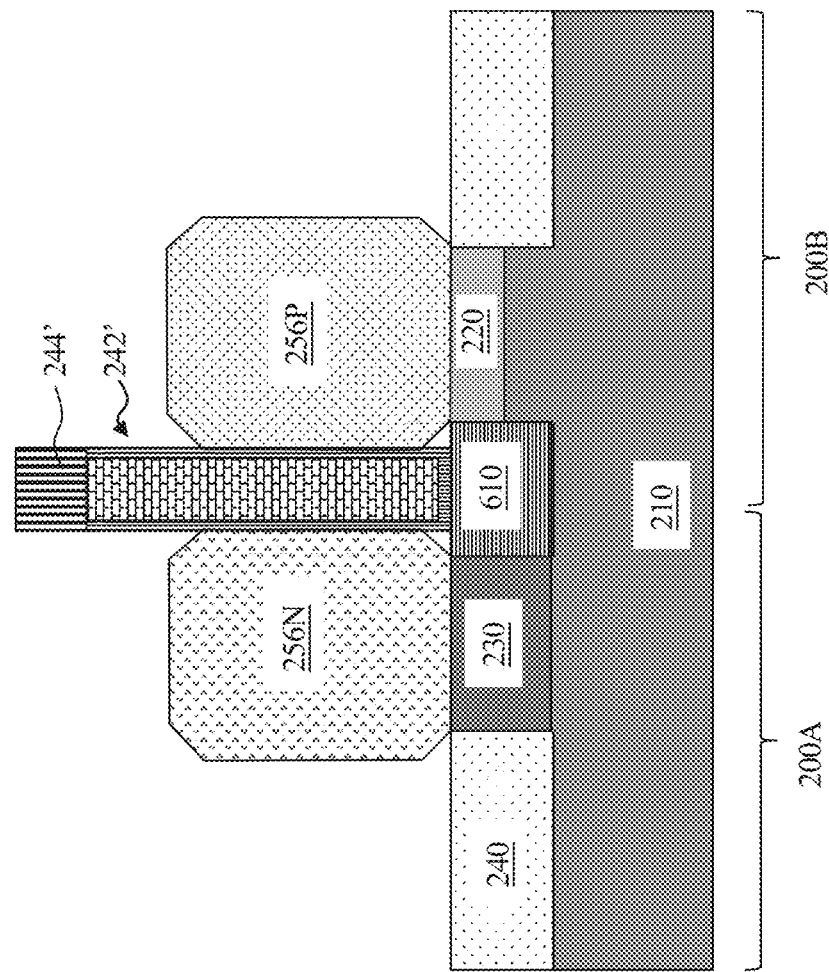
Figure 37:
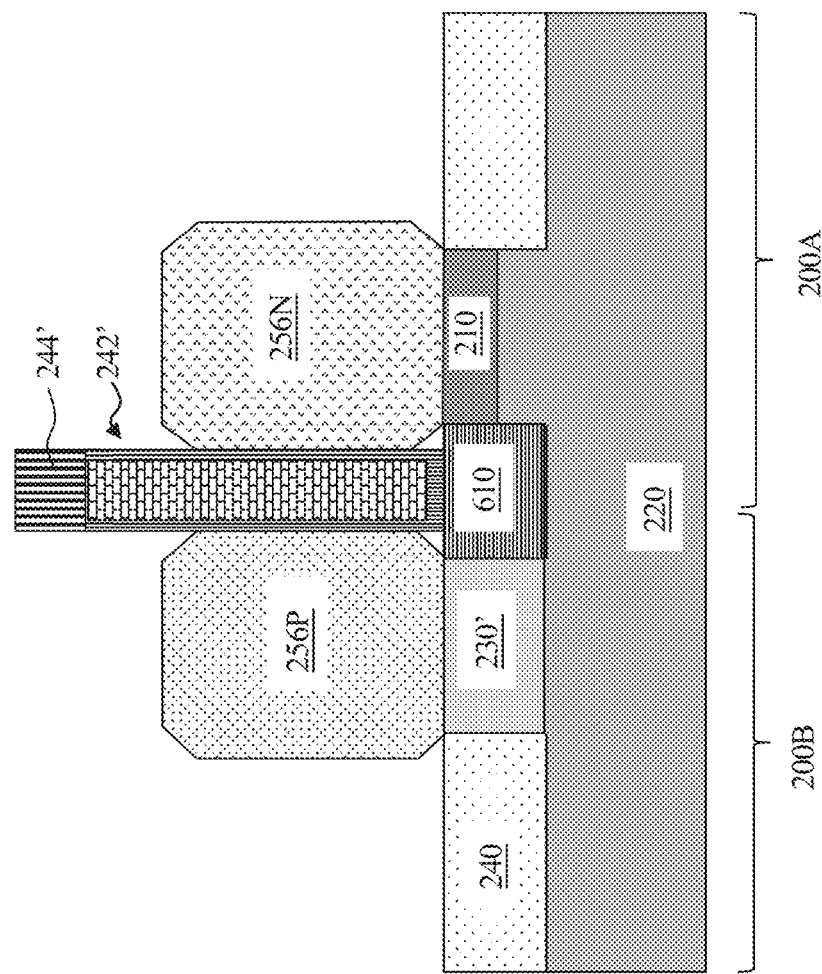

The method 100 then proceeds to blocks 116, 118, 120, and 122 as described above. Cross-sectional views of the workpiece 600 taken along line A-A' and line B-B' are omitted for reason of simplicity. As shown in FIG. 36, the dielectric fin 242' is formed over the dielectric spacer 610 to isolate the two-adjacent source/drain features 256N and 256P. The width of the dielectric fin 242' formed on the dielectric spacer 610 is smaller than the width of the dielectric fin 242 formed on the STI feature 240. Thus, a spacing between two adjacent source/drain features is reduced, leading to an increased density. FIG. 37 depicts a cross-sectional review of a workpiece 600' when viewed along the X direction. The workpiece 600' may be in a way similar to the workpiece 300 described above with reference to FIG. 21, except that a dimension-reduced dielectric fin 242' is formed over the dielectric spacer 610. Description of similar features are omitted for reason of simplicity.

Figure 38:
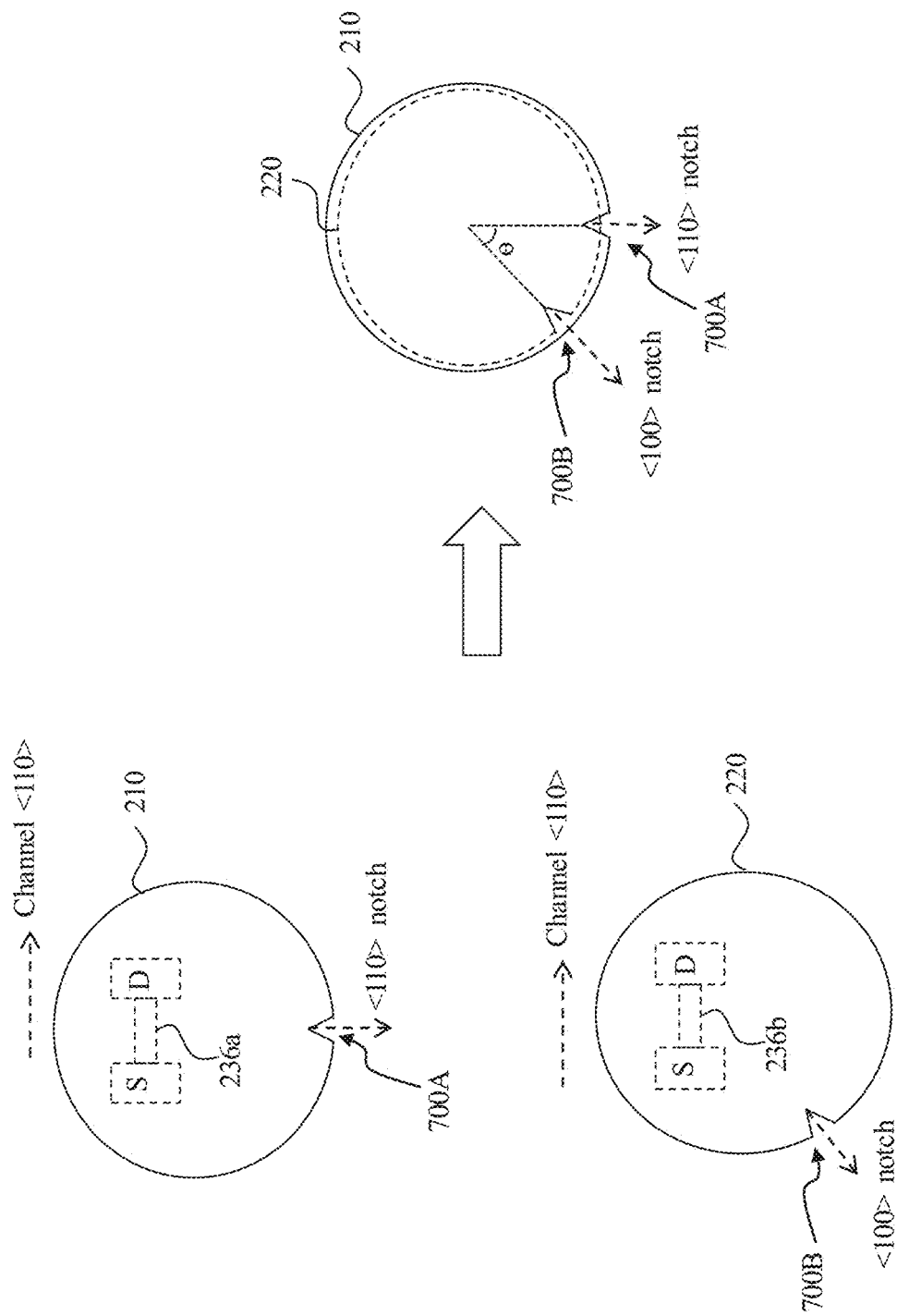
FIGS. 38-40 illustrate alternative embodiments of bonding a first substrate to a second substrate, according to one or more aspects of the present disclosure.
Figure 39:
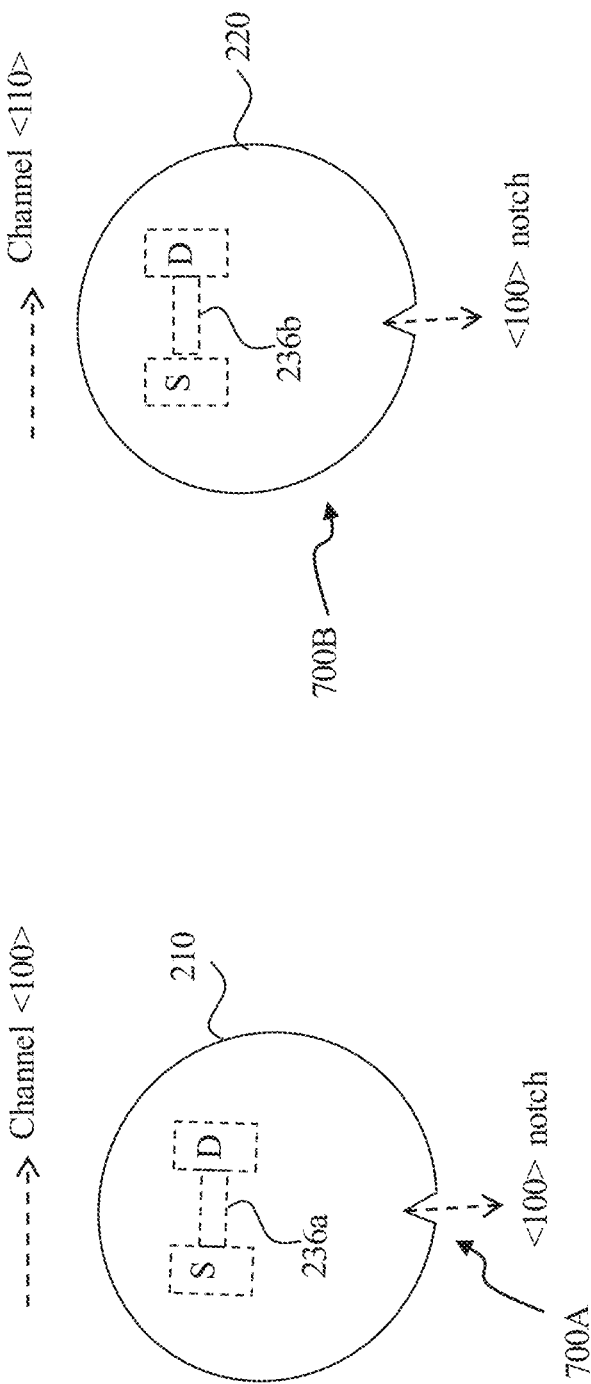
Figure 40:
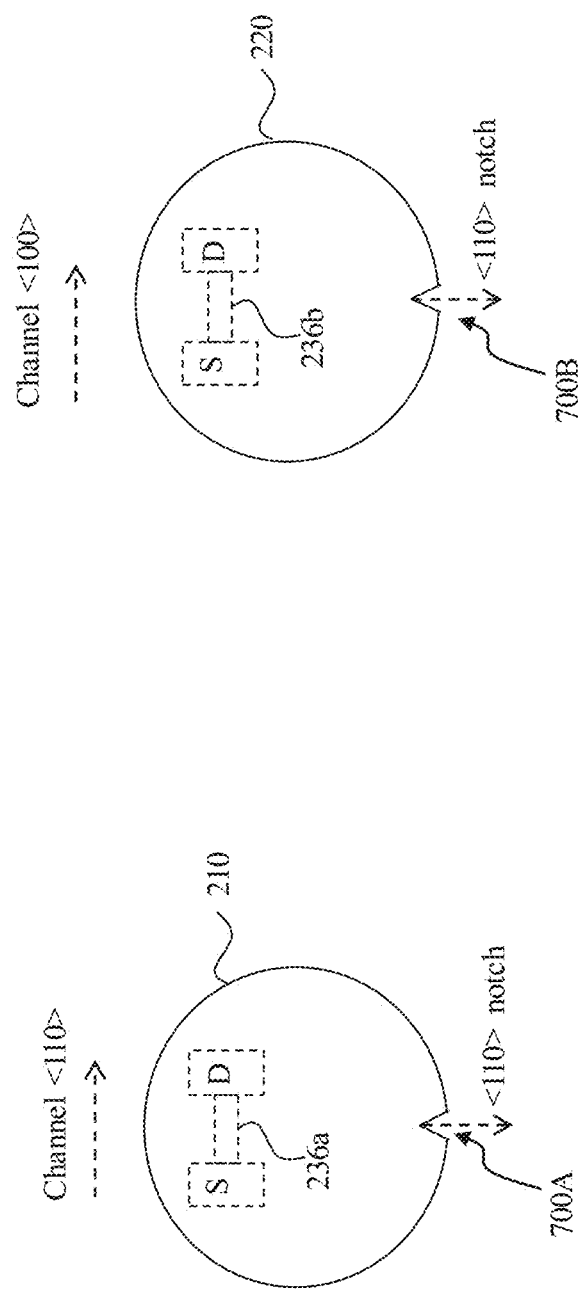

FIGS. 38-40 illustrate exemplary embodiments of bonding the first wafer 210 to the second wafer 220, according to one or more aspects of the present disclosure. In present embodiments, a top surface of the first wafer 210 has the (100) crystal plane and a top surface of the second wafer 220 has the (110) crystal plane. By adjusting the notch alignment angles and/or rotating the first wafer 210 and/or the second wafer 220, channel directions of the N-type MBC transistors and P-type MBC transistors may be adjusted such that both electron and hole may have respective optimum carrier mobility.

As shown in FIG. 38, the first wafer 210 includes a first notch 700A orientated in <110> direction, the second wafer 220 includes a second notch 700B orientated in <100> direction. The first wafer 210 is then bonded with the second wafer 220, and N-type MBC transistors and P-type MBC transistors are then formed, as described above in method 100. When bonding the first wafer 210 with the second wafer 220, an angle θ between the first notch 700A and the second notch 700B is substantially equal to 45° (that is, the first notch 700A is not aligned with the second notch 700B), and channel layers 236a of the N-type MBC transistors formed on the first region 200A and channel layers 236b of the P-type MBC transistors formed on the second region 200B may have a same crystal orientation such as <110>.

In embodiment represented in FIG. 39, the first wafer 210 includes a first notch 700A orientated in <100> direction, the second wafer 220 includes a second notch 700B orientated in <100> direction. When bonding the first wafer 210 with the second wafer 220, the first wafer 210 and/or the second wafer 220 may be rotated such that channel layers 236a of the N-type MBC transistors formed on the first region 200A has a first direction (e.g., <100>) different from a second direction (e.g., <110>) of the channel layers 236b of the P-type MBC transistors formed on the second region 200B and both N-type MBD transistors and P-type transistors have corresponding respective optimal carrier mobilities.

In embodiments represented in FIG. 40, the first wafer 210 includes a first notch 700A orientated in <110> direction, the second wafer 220 includes a second notch 700B orientated in <110> direction. Channel layers 236a of the N-type MBC transistors formed on the first region 200A has a first direction (e.g., <110>) different from a second direction (e.g., <100>) of the channel layers 236b of the P-type MBC transistors formed on the second region 200B.

Embodiments of the present disclosure provide advantages. Methods of the present disclosure form a hybrid substrate for forming both N-type MBC transistors and P-type MBC transistors with respective optimum carrier mobility. Therefore, performances of the semiconductor structure may be improved. In addition, the methods of the present disclosure may reduce the leakage current associated with the N-type MBC transistors or P-type MBC transistors. In some embodiments, a spacing between two adjacent active regions may be reduced. Thus, the device density may be increased.

The present disclosure provides for many different embodiments. Semiconductor structures and methods of fabrication thereof are disclosed herein. In one exemplary aspect, the present disclosure is directed to a method. The method includes forming a substrate comprising a first wafer disposed over a second wafer, a top surface of the first wafer including a first crystal orientation and a top surface of the second wafer including a second crystal orientation different than the first crystal orientation, performing an etching process to etch a first region of the first wafer and expose a portion of the second wafer under the first region to form a trench, forming an epitaxial layer in the trench, a top surface of the epitaxial layer having the second crystal orientation, epitaxially forming a vertical stack of alternating channel layers and sacrificial layers over the substrate, top surfaces of the channel layers disposed directly over the first wafer comprise the first crystal orientation, and top surfaces of the channel layers disposed directly over the epitaxial layer comprise the second crystal orientation, and patterning the vertical stack to form a first fin-shaped structure directly over the first wafer and a second fin-shaped structure over the epitaxial layer.

In some embodiments, the method may also include recessing source/drain regions of the first fin-shaped structure and the second fin-shaped structure. The method may also include forming first source/drain features over the source/drain regions of the first fin-shaped structure and forming second source/drain features over the source/drain regions of the second fin-shaped structure. A dopant type of the first source/drain features may be different than a dopant type of the second source/drain features.

In some embodiments, the top surface of the first wafer may include a (100) crystal plane, the top surface of the second wafer may include a (110) crystal plane, and the first source/drain features may include N-type source/drain features and the second source/drain features may include P-type source/drain features.

In some embodiments, the top surface of the first wafer may include a (110) crystal plane, the top surface of the second wafer may include a (100) crystal plane, and the first source/drain features may include P-type source/drain features, and the second source/drain features may include N-type source/drain features.

In some embodiments, a distance between a bottommost channel layer of the second fin-shaped structure and the second wafer may be greater than a distance between a bottommost channel layer of the first fin-shaped structure and the second wafer.

In some embodiments, after the patterning, the first fin-shaped structure may include the vertical stack, the first wafer, and a portion of the second wafer, and the second fin-shaped structure may include the vertical stack, the epitaxial layer, and a portion of the second wafer.

In some embodiments, the method may also include, after the patterning, forming an isolation feature over the substrate and disposed between the first fin-shaped structure and the second fin-shaped structure, a top surface of the isolation feature may be below the top surface of the first wafer and above a bottom surface of the first wafer.

In some embodiments, the method may also include forming an etch mask over the first wafer to expose the first region of the first wafer while covering a second region of the first wafer before the performing of the etching process, depositing a conformal dielectric material layer over the substrate after the performing of the etching process to form the trench, and etching back the dielectric material layer to form a dielectric layer extending along a sidewall surface of the trench. A top surface of the dielectric layer may be coplanar with a top surface of the etch mask. In some embodiments, the substrate may also include an oxide layer sandwiched between the first wafer and the second wafer.

In some embodiments, the performing of the etching process may also etch a portion of the oxide layer directly under the first region of the first wafer, the patterning of the vertical stack may also pattern the oxide layer, and, after the patterning, the first fin-shaped structure may include the vertical stack, the first wafer, and the oxide layer.

In another exemplary aspect, the present disclosure is directed to a method. The method includes providing a hybrid substrate comprising a first region and a second region, the first region comprises a first semiconductor layer directly over a third semiconductor layer, and the second region comprises a second semiconductor layer directly over the third semiconductor layer, a top surface of the first semiconductor layer includes a first crystal orientation and a top surface of the second semiconductor layer includes a second crystal orientation different than the first crystal orientation, epitaxially growing a vertical stack of alternating sacrificial layers and channel layers over the first region and the second region of the hybrid substrate, patterning the vertical stack and the hybrid substrate to form a first fin-shaped structure over the first region and a second fin-shaped structure over the second region, forming first type source/drain features over the first region and second type source/drain features over the second region. The first fin-shaped structure includes a portion of the first semiconductor layer in the first region, a portion of the vertical stack in the first region, and a portion of the third semiconductor layer in the first region. The second fin-shaped structure includes a portion of the vertical stack in the second region, the second semiconductor layer in the second region, and a portion of the third semiconductor layer in the second region.

In some embodiments, the providing of the hybrid substrate may include providing the second semiconductor layer and the third semiconductor layer, a top surface of the third semiconductor layer has the first crystal orientation. The providing of the hybrid substrate may include bonding a bottom surface of the second semiconductor layer to the top surface of the third semiconductor layer, removing a portion of the second semiconductor layer in the first region and a portion of the third semiconductor layer thereunder to form a trench over the first region, and epitaxially forming the first semiconductor layer over the trench. The first semiconductor layer may be disposed over the third semiconductor layer and adjacent to the second semiconductor layer.

In some embodiments, the method may also include forming an oxide layer over the third semiconductor layer before the bonding, the second semiconductor layer may be bonded to a top surface of the oxide layer. After the patterning, the first fin-shaped structure is free of the oxide layer, and the second fin-shaped structure includes the oxide layer.

In some embodiments, the first type source/drain features may include N-type source/drain features formed over (100) silicon and the second type source/drain features may include P-type source/drain features formed over (110) silicon.

In some embodiments, the first type source/drain features may include P-type source/drain features formed over (110) silicon and the second type source/drain features may include N-type source/drain features formed over (100) silicon.

In some embodiments, the method may also include performing an etching process to selectively remove the sacrificial layers, forming a first gate structure wrapping around and over a portion of the channel layers over the first region, and forming a second gate structure wrapping around and over a portion of the channel layers over the second region, a work function layer of the first gate structure is different than a work function layer of the second gate structure.

In yet another exemplary aspect, the present disclosure is directed to a semiconductor structure. The semiconductor structure includes a substrate having a first region and a second region, a first semiconductor layer disposed over the first region, the first semiconductor layer comprises a top surface having a (100) crystal plane, a second semiconductor layer disposed over the second region, the second semiconductor layer comprises a top surface having a (110) crystal plane, a first plurality of nanostructures over the first semiconductor layer and a second plurality of nanostructures over the second semiconductor layer, first source/drain features coupled to each of the first plurality of nanostructures, second source/drain features coupled to each of the second plurality of nanostructures, a first gate structure wrapping around each of the first plurality of nanostructures, and a second gate structure wrapping around each of the second plurality of nanostructures, the first source/drain features comprise N-type source/drain features and a top surface of each of the first plurality of nanostructures comprises the (100) crystal plane, and the second source/drain features comprise P-type source/drain features and a top surface of each of the second plurality of nanostructures comprises the (110) crystal plane.

In some embodiments, the substrate may include silicon, and a top surface of the substrate may include a (100) crystal plane. In some embodiments, the substrate may include silicon, and a top surface of the substrate may include a (110) crystal plane. In some embodiments, a top surface of the substrate in the first region may be lower than a top surface of the substrate in the second region.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a substrate comprising a first wafer disposed over a second wafer, a top surface of the first wafer including a first crystal orientation and a top surface of the second wafer including a second crystal orientation different than the first crystal orientation;
    performing an etching process to etch a first region of the first wafer and expose a portion of the second wafer under the first region to form a trench;
    forming an epitaxial layer in the trench, a top surface of the epitaxial layer having the second crystal orientation, wherein the epitaxial layer contacts the first wafer at an interface;
    epitaxially forming a vertical stack of alternating channel layers and sacrificial layers over the substrate, wherein top surfaces of the channel layers disposed directly over the first wafer comprise the first crystal orientation, and top surfaces of the channel layers disposed directly over the epitaxial layer comprise the second crystal orientation; and
    patterning the vertical stack to form a first fin-shaped structure directly over the first wafer and a second fin-shaped structure over the epitaxial layer.

2. The method of claim 1, further comprising:
    recessing source/drain regions of the first fin-shaped structure and the second fin-shaped structure; and
    forming first source/drain features over the source/drain regions of the first fin-shaped structure and forming second source/drain features over the source/drain regions of the second fin-shaped structure,
    wherein a dopant type of the first source/drain features is different than a dopant type of the second source/drain features.

3. The method of claim 2,
    wherein the top surface of the first wafer comprises a (100) crystal plane, the top surface of the second wafer comprises a (110) crystal plane, and
    wherein the first source/drain features comprise N-type source/drain features and the second source/drain features comprise P-type source/drain features.

4. The method of claim 2,
    wherein the top surface of the first wafer comprises a (110) crystal plane, the top surface of the second wafer comprises a (100) crystal plane, and
    wherein the first source/drain features comprise P-type source/drain features, and the second source/drain features comprise N-type source/drain features.

5. The method of claim 1, wherein a vertical distance between a bottommost channel layer of the second fin-shaped structure and the second wafer is greater than a vertical distance between a bottommost channel layer of the first fin-shaped structure and the second wafer.

6. The method of claim 1,
    wherein, after the patterning, the first fin-shaped structure comprises the vertical stack, the first wafer, and a portion of the second wafer, and
    the second fin-shaped structure comprises the vertical stack, the epitaxial layer, and a portion of the second wafer.

7. The method of claim 1, further comprising:
    after the patterning, forming an isolation feature over the substrate and disposed between the first fin-shaped structure and the second fin-shaped structure,
    wherein a top surface of the isolation feature is below the top surface of the first wafer and is above a bottom surface of the first wafer.

8. The method of claim 1, further comprising:
    before the performing of the etching process, forming an etch mask over the first wafer to expose the first region of the first wafer while covering a second region of the first wafer; and
    after the forming of the epitaxial layer in the trench, selectively removing the etch mask.

9. A method, comprising:
    providing a hybrid substrate comprising a first region and a second region, wherein the first region comprises a first semiconductor layer directly over a third semiconductor layer, and the second region comprises a second semiconductor layer directly over the third semiconductor layer, wherein a top surface of the first semiconductor layer includes a first crystal orientation and a top surface of the second semiconductor layer includes a second crystal orientation different than the first crystal orientation;
    epitaxially growing a vertical stack of alternating sacrificial layers and channel layers over the first region and the second region of the hybrid substrate;
    patterning the vertical stack and the hybrid substrate to form a first fin-shaped structure over the first region and a second fin-shaped structure over the second region, wherein the patterning further forms a trench extending from the first fin-shaped structure to the second fin-shaped structure, the trench exposes the first semiconductor layer, the second semiconductor layer, and the third semiconductor layer; and forming first type source/drain features over the first region and second type source/drain features over the second region, wherein the first fin-shaped structure comprises a portion of the first semiconductor layer in the first region, a portion of the vertical stack in the first region, and a portion of the third semiconductor layer in the first region, and wherein the second fin-shaped structure comprises a portion of the vertical stack in the second region, the second semiconductor layer in the second region, and a portion of the third semiconductor layer in the second region.

10. The method of claim 9, wherein the providing of the hybrid substrate comprises:

providing the second semiconductor layer and the third semiconductor layer, wherein a top surface of the third semiconductor layer has the first crystal orientation;

bonding a bottom surface of the second semiconductor layer to the top surface of the third semiconductor layer;

removing a portion of the second semiconductor layer in the first region and a portion of the third semiconductor layer thereunder to form a trench over the first region; and epitaxially forming the first semiconductor layer over the trench, wherein the first semiconductor layer is disposed over the third semiconductor layer and adjacent to the second semiconductor layer.

11. The method of claim 9, wherein the first type source/drain features comprise N-type source/drain features formed over (100) silicon and the second type source/drain features comprise P-type source/drain features formed over (110) silicon.

12. The method of claim 9, wherein the first type source/drain features comprise P-type source/drain features formed over (110) silicon and the second type source/drain features comprise N-type source/drain features formed over (100) silicon.

13. The method of claim 9, further comprising:

performing an etching process to selectively remove the sacrificial layers;

forming a first gate structure wrapping around and over a portion of the channel layers over the first region; and forming a second gate structure wrapping around and over a portion of the channel layers over the second region, wherein a work function layer of the first gate structure is different than a work function layer of the second gate structure.

14. A method, comprising:

forming a first fin-shaped active region over a first substrate, the first fin-shaped active region comprising a plurality of first channel layers interleaved by a plurality of first sacrificial layers, the first fin-shaped active region further comprising an epitaxial semiconductor layer disposed between the first substrate and the plurality of first sacrificial layers;

forming a second fin-shaped active region adjacent to the first fin-shaped active region and over the first substrate, the second fin-shaped active region comprising a plurality of second channel layers interleaved by a plurality of second sacrificial layers, the second fin-shaped active region further comprising a second substrate disposed between the first substrate and the plurality of second sacrificial layers, wherein a bottom surface of the second substrate is above a bottom surface of the epitaxial semiconductor layer, wherein crystal plane of each channel layer of the plurality of first channel layers is different than crystal plane of each channel layer of the plurality of second channel layers;

forming a gate structure over the first fin-shaped active region and the second fin-shaped active region;

forming first-type source/drain features coupled to the plurality of first channel layers; and forming second-type source/drain features coupled to the plurality of second channel layers, the first-type source/drain features and the second-type source/drain features having different dopant polarities.

15. The method of claim 14, further comprising:

forming an isolation feature extending between the epitaxial semiconductor layer and the second substrate.

16. The method of claim 15, wherein a top surface of the isolation feature is above an interface between the epitaxial semiconductor layer and the first substrate and an interface between the second substrate and the first substrate.

17. The method of claim 14, further comprising:

after the forming of the first-type source/drain features and second-type source/drain features, selectively removing the gate structure;

selectively removing the plurality of first sacrificial layers and the plurality of second sacrificial layers;

forming a first gate stack wrapping around the plurality of first channel layers; and forming a second gate stack wrapping around the plurality of second channel layers, wherein the first and second gate stacks have different compositions.

18. The method of claim 14, wherein the first substrate comprises a (100) crystal plane and is different from the crystal plane of each channel layer of the plurality of second channel layers.

19. The method of claim 18, wherein the first-type source/drain features comprise N-type doped source/drain features, and the second-type source/drain features comprise P-type doped source/drain features.

20. The method of claim 18, wherein the second substrate is separated from the epitaxial semiconductor layer along a first direction, and the first and second fin-shaped active regions extend lengthwise along a second direction substantially perpendicular to the first direction.

* * * * *